US012369288B2

(12) United States Patent
Guo et al.

(10) Patent No.: US 12,369,288 B2
(45) Date of Patent: Jul. 22, 2025

(54) CIRCUIT BOARD ASSEMBLY AND ELECTRONIC DEVICE

(71) Applicant: Honor Device Co., Ltd., Shenzhen (CN)

(72) Inventors: Jianqiang Guo, Shenzhen (CN); Wenjun Luo, Shenzhen (CN); Jun Li, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/044,687

(22) PCT Filed: Aug. 22, 2022

(86) PCT No.: PCT/CN2022/113838
§ 371 (c)(1),
(2) Date: Mar. 9, 2023

(87) PCT Pub. No.: WO2023/051091
PCT Pub. Date: Apr. 6, 2023

(65) Prior Publication Data
US 2024/0292581 A1 Aug. 29, 2024

(30) Foreign Application Priority Data

Sep. 30, 2021 (CN) .......................... 202111162855.0

(51) Int. Cl.
*H05K 9/00* (2006.01)
*H05K 1/14* (2006.01)
*H05K 1/18* (2006.01)

(52) U.S. Cl.
CPC ............ *H05K 9/0032* (2013.01); *H05K 1/144* (2013.01); *H05K 1/181* (2013.01); *H05K 2201/10371* (2013.01); *H05K 2201/10545* (2013.01)

(58) Field of Classification Search
CPC ...... H05K 9/0032; H05K 1/144; H05K 1/181; H05K 2201/10371; H05K 2201/10545
(Continued)

(56) References Cited

U.S. PATENT DOCUMENTS 5,438,482 A  8/1995 Nakamura et al.
6,002,086 A  12/1999 Yajima
(Continued)

FOREIGN PATENT DOCUMENTS

CA  1137199 A  12/1982
CN  1327712 A  12/2001
(Continued)

*Primary Examiner* — Andargie M Aychillhum
(74) *Attorney, Agent, or Firm* — Slater Matsil, LLP

(57) ABSTRACT

Embodiments of this application provide a circuit board assembly and an electronic device. The circuit board assembly includes: a first circuit board and a second circuit board stacked with the first circuit board, where the first circuit board is provided with a first shielding frame on a surface facing toward the second circuit board, the second circuit board is provided with a second shielding frame on a surface facing toward the first circuit board, and opposite end portions of the first shielding frame and the second shielding frame are connected to a shared shielding cover, so that the shared shielding cover, the first shielding frame, and the second shielding frame enclose a shielding cavity.

20 Claims, 19 Drawing Sheets

(58) Field of Classification Search
USPC .......................................................... 361/804
See application file for complete search history.

(56) References Cited

U.S. PATENT DOCUMENTS

| | | |
|---|---|---|
| 6,930,891 B1 | 8/2005 | Hama et al. |
| 2005/0236171 A1 | 10/2005 | Garcia |
| 2012/0293971 A1 | 11/2012 | Tsai |
| 2013/0016484 A1 | 1/2013 | Yoo |
| 2017/0150657 A1 | 5/2017 | Seo et al. |
| 2020/0163253 A1* | 5/2020 | Lunsman .................. G06F 1/20 |
| 2021/0274655 A1* | 9/2021 | Jin .......................... H01F 27/34 |
| 2023/0019918 A1 | 1/2023 | Yu et al. |

FOREIGN PATENT DOCUMENTS

| | | |
|---|---|---|
| CN | 201563343 U | 8/2010 |
| CN | 201821637 U | 5/2011 |
| CN | 201956545 U | 8/2011 |
| CN | 102695409 A | 9/2012 |
| CN | 102892280 A | 1/2013 |
| CN | 203101443 U | 7/2013 |
| CN | 203590673 U | 5/2014 |
| CN | 205356944 U | 6/2016 |
| CN | 108390174 A | 8/2018 |
| CN | 211378664 U | 8/2020 |
| CN | 112768932 A | 5/2021 |
| EP | 0844813 A2 | 5/1998 |
| EP | 1130953 A1 | 9/2001 |
| EP | 2546996 A2 | 1/2013 |
| GB | 2445378 A | 7/2008 |
| WO | 2021103975 A1 | 6/2021 |

* cited by examiner

CIRCUIT BOARD ASSEMBLY AND ELECTRONIC DEVICE

CROSS-REFERENCE TO RELATED APPLICATIONS

This application is a national stage of International Application No. PCT/CN2022/113838, filed on Aug. 22, 2022, which claims priority to Chinese Patent Application No. 202111162855.0, filed on Sep. 30, 2021. The disclosures of both of the aforementioned applications are hereby incorporated by reference in their entireties.

TECHNICAL FIELD

Embodiments of this application relate to the technical field of terminals, and in particular, to a circuit board assembly and an electronic device.

BACKGROUND

Due to the small size of an electronic device, available space inside the electronic device is limited. An electronic device usually needs to accommodate components such as a screen, a battery, a printed circuit board, and a camera module within limited space, which poses high requirements on efficient space utilization of the electronic device.

In the related art, some electronic products use stack-type circuit boards. A stack-type circuit board includes a plurality of stacked circuit boards, and the circuit boards are used for carrying electronic components. The stack-type circuit board makes full use of vertical space of the circuit board, thereby reducing space occupied by a conventional two-dimensional planar circuit board. However, in the stack-type circuit board, a shielding case needs to be provided for an electronic component that requires electromagnetic shielding, and the shielding case causes a larger vertical dimension of the stack-type circuit board. As a result, the stack-type circuit board occupies a large vertical space.

SUMMARY

Embodiments of this application provide a circuit board assembly and an electronic device, which can solve the problem that the stack-type circuit board occupies a large vertical space in the related art.

According to a first aspect, this application provides a circuit board assembly, including: a first circuit board and a second circuit board stacked with the first circuit board, the first circuit board is provided with a first shielding frame on a surface facing toward the second circuit board, the second circuit board is provided with a second shielding frame on a surface facing toward the first circuit board, and opposite end portions of the first shielding frame and the second shielding frame are connected to a shared shielding cover, so that the shared shielding cover, the first shielding frame, and the second shielding frame enclose a shielding cavity.

In the circuit board assembly provided in the embodiments of this application, the shielding frames on the opposite surfaces of the first circuit board and the second circuit board share a shared shielding cover, so that the electromagnetic shielding needs of components on the opposite surfaces of the two adjacent circuit boards can be satisfied, and it is also advantageous to reduce the vertical size of the circuit board assembly, and reduce the vertical space occupied by the circuit board assembly, thereby meeting the electromagnetic shielding needs of the components within a limited space.

In a possible implementation, at least one of the first shielding frame and the second shielding frame is detachably connected to the shared shielding cover. This helps achieve both the assembly efficiency and assembly flexibility of the circuit board assembly.

In a possible implementation, at least one of the first shielding frame and the second shielding frame includes: a shielding frame body and an elastic abutment portion, where the elastic abutment portion is disposed at an end portion of the shielding frame body that faces toward the shared shielding cover, and the elastic abutment portion abuts against the shared shielding cover. This helps achieve both the assembly efficiency and assembly flexibility of the circuit board assembly.

In a possible implementation, the elastic abutment portion is tilted relative to the shielding frame body, and in a direction away from the shielding frame body, the elastic abutment portion is tilted toward the interior of the shielding cavity. This helps reduce the space occupied by the second shielding frame.

In a possible implementation, one of the first shielding frame and the second shielding frame is provided with a first clamping slot, the other of the first shielding frame and the second shielding frame is provided with a first protrusion portion projecting toward the interior of the shielding cavity, and the first protrusion portion fits the first clamping slot. In this way, the first shielding frame can be clamped with the second shielding frame, which helps achieve both the assembly efficiency and assembly flexibility of the circuit board assembly.

In a possible implementation, the first shielding frame is provided with the first clamping slot at an end portion close to the shared shielding cover, and the second shielding frame is provided with the first protrusion portion at an end portion close to the shared shielding cover. This helps save materials and further reduce the space occupied by the circuit board assembly.

In a possible implementation, the first clamping slot includes a strip-shaped blind hole extending in a circumferential direction of the first shielding frame. In this way, even if a manufacturing error occurs, the first protrusion portion can snap into the first clamping slot smoothly, which helps improve the assembly efficiency of the circuit board assembly.

In a possible implementation, the first protrusion portion includes a strip-shaped rib extending in a circumferential direction of the second shielding frame. This helps improve the connection reliability between the second shielding frame and the first shielding frame.

In a possible implementation, the first protrusion portion includes a plurality of bosses; and the plurality of bosses are distributed at intervals in the circumferential direction of the second shielding frame. This helps the first protrusion portion to smoothly snap into the first clamping slot, thereby improving the assembly efficiency of the second shielding frame and the first shielding frame.

In a possible implementation, the first protrusion portion has a first guiding surface for guiding the first protrusion portion into the first clamping slot. This helps the first protrusion portion to smoothly enter the first clamping slot, thereby improving the assembly efficiency of the second shielding frame and the first shielding frame.

In a possible implementation, the shared shielding cover is provided with a plurality of columns arranged at intervals on at least one of a surface facing toward the first shielding frame and a surface facing toward the second shielding frame, and the columns are clamped with the corresponding shielding frame. This helps improve the assembly efficiency of the circuit board assembly.

In a possible implementation, the columns are arranged on at least two opposite edges of the surface of the shared shielding cover. This helps improve the assembly efficiency of the circuit board assembly.

In a possible implementation, the shared shielding cover is provided with the columns on the surface facing toward the first shielding frame and the surface facing toward the second shielding frame; and the columns are each provided with a second protrusion portion, and inner surfaces of the first shielding frame and the second shielding frame are provided with second clamping slots that fit the second protrusion portions. In this way, during assembly, the second protrusion portion can smoothly snap into the second clamping slot, which helps improve the assembly efficiency of the circuit board assembly.

In a possible implementation, the second protrusion portion has a second guiding surface for guiding the second protrusion portion into the second clamping slot. This helps the second protrusion portion to smoothly enter the second clamping slot, thereby improving the assembly efficiency of the circuit board assembly.

In a possible implementation, the second clamping slot includes a strip-shaped blind hole extending in a circumferential direction of the corresponding shielding frame. In this way, even if a manufacturing error occurs, the second protrusion portion can still enter the second clamping slot smoothly, which helps improve the assembly efficiency of the circuit board assembly.

In a possible implementation, at least one of the first shielding frame and second shielding frame includes: a shielding frame body and a magnetic attraction portion, where the magnetic attraction portion slidably fits an end portion of the shielding frame body that faces toward the shared shielding cover to connect the shielding frame body and the shared shielding cover by a magnetic attraction force. This helps achieve both the assembly efficiency and assembly flexibility of the circuit board assembly.

In a possible implementation, the magnetic attraction portion has a sliding groove, and an end portion of the shielding frame body that faces toward the shared shielding cover slidably fits the sliding groove. This helps improve the connection reliability between the magnetic attraction portion and the shielding frame body.

In a possible implementation, a surface of the magnetic attraction portion is provided with an electromagnetic shielding layer made of an electromagnetic shielding material. This helps improve the electromagnetic shielding effect.

According to a second aspect, this application provides an electronic device, including: a housing and the circuit board assembly described above, where the circuit board assembly is disposed in an accommodating space of the housing.

REFERENCE NUMERALS DESCRIPTION

100—electronic device;
10—housing; 11—rear cover; 12—middle frame; 121—metal middle plate; 122—frame;

20—circuit board assembly; 21—first circuit board; 22—first component; 23—second circuit board; 24—second component; 25—connecting plate; 26—shielding case;
27—first shielding frame; 271—first clamping slot; 272—second clamping slot;
28—second shielding frame; 281—elastic abutment portion; 282—shielding frame body; 283—first protrusion portion; 284—magnetic attraction portion; 2841—sliding groove; 2842—electromagnetic shielding layer;
29—shared shielding cover; 291—column; 2911—second protrusion portion; 292—slot;
30—display screen;
40—battery.

DETAILED DESCRIPTION OF ILLUSTRATIVE EMBODIMENTS

The circuit assembly provided in the embodiments of this application may be applied to an electronic device 1. The electronic device 1 may be a mobile terminal a fixed terminal, or a foldable device with circuit assemblies, for example, a desktop computer, a laptop, a tablet computer, an ultra-mobile personal computer (ultra-mobile personal computer, UMPC), a handheld computer, an intercom, a netbook, a POS machine, a personal digital assistant (personal digital assistant, PDA) or the like.

Figure 1:
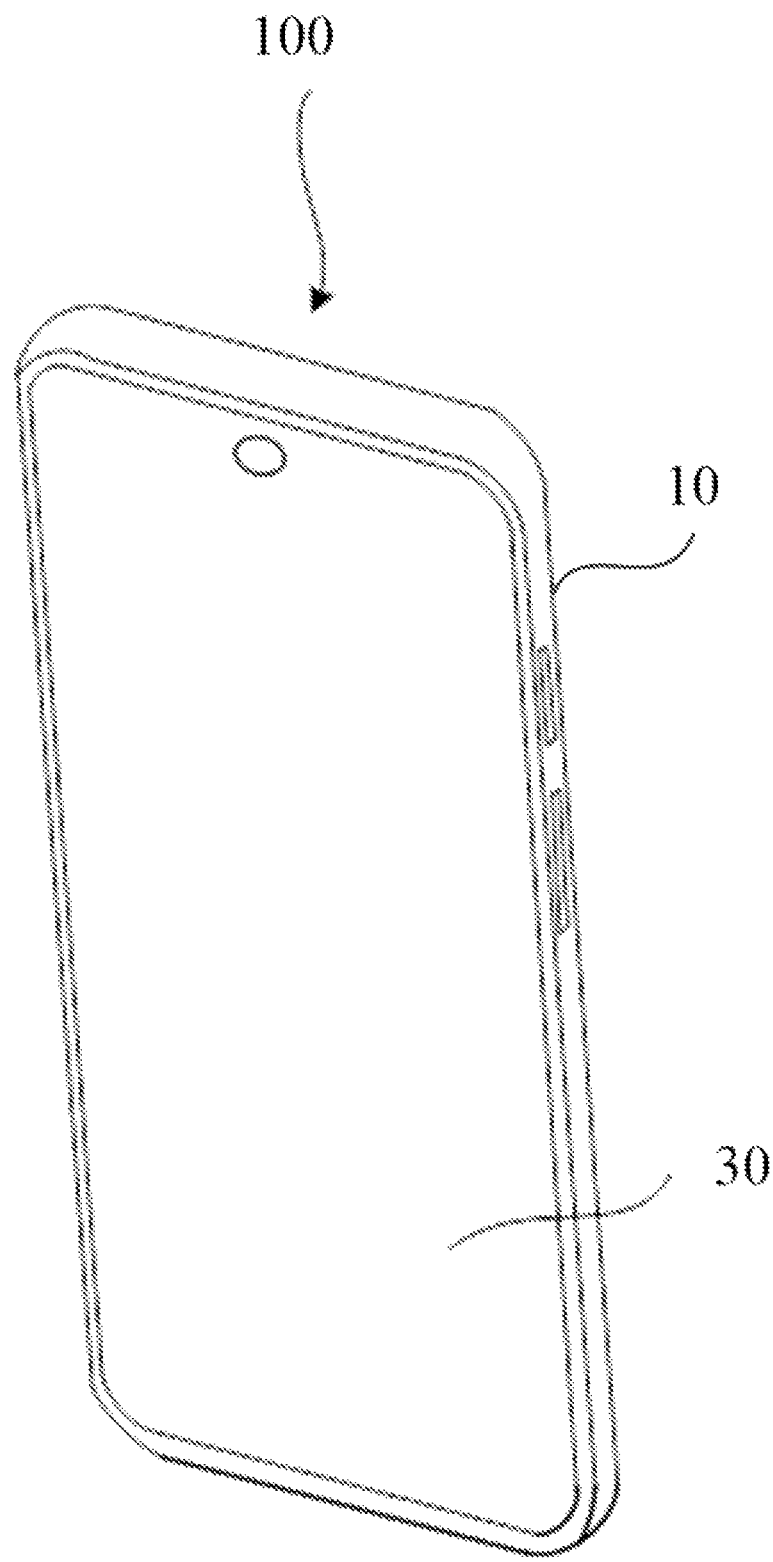
FIG. 1 is a schematic structural diagram of an electronic device.
Figure 2:
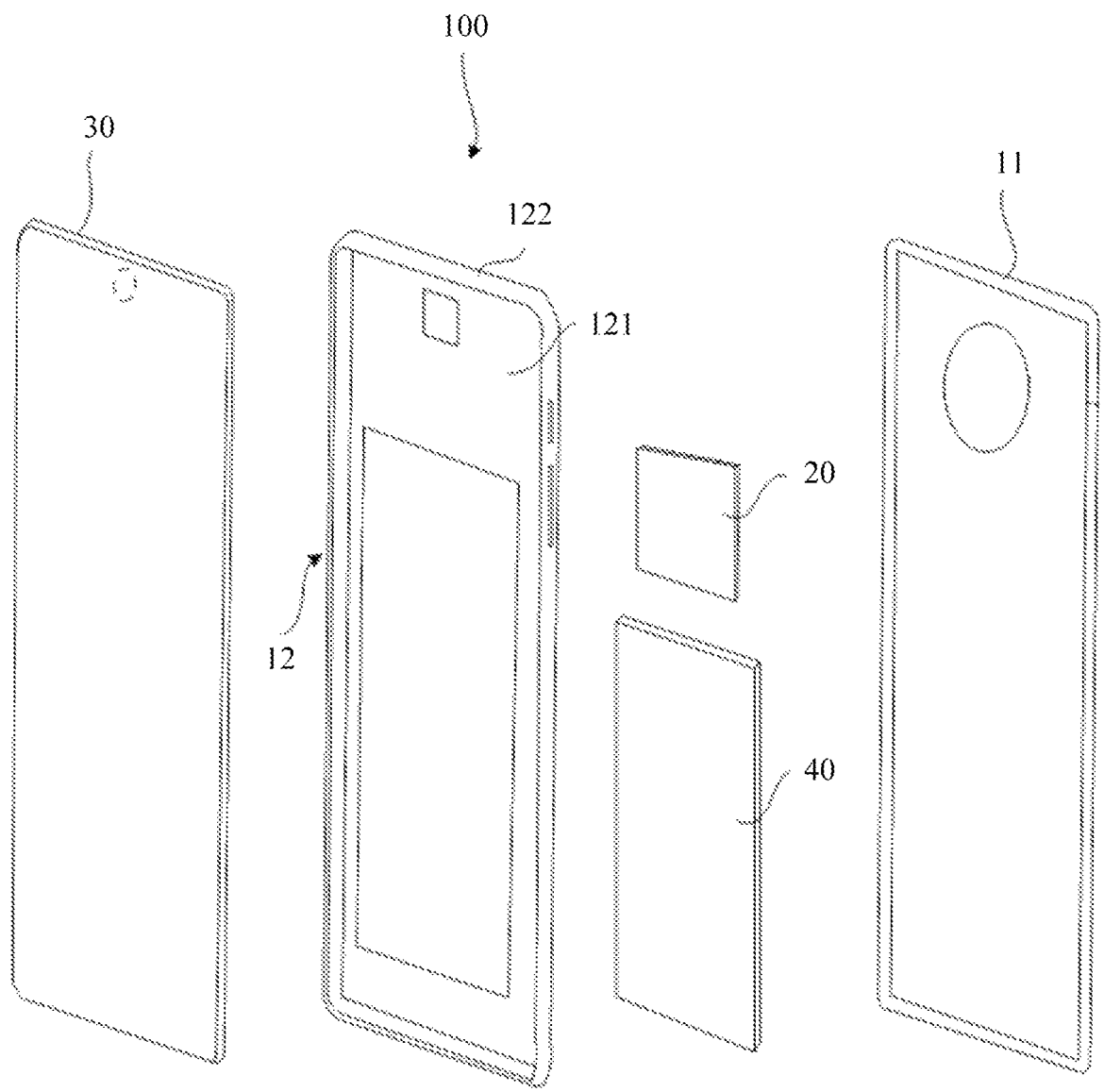
FIG. 2 is an exploded schematic structural diagram of an electronic device.

FIG. 1 is a three-dimensional schematic structural diagram of an electronic device. FIG. 2 is an exploded schematic structural diagram of an electronic device. Referring to FIG. 1 and FIG. 2, the electronic device 100 provided in the embodiments of this application may include: a housing 10 that can provide a structural framework for the electronic device 100. The housing 10 has an accommodating space, and a circuit board assembly 20 may be disposed in the accommodating space. In addition, the accommodating space may further be used to accommodate a battery 40, a speaker, a microphone, a receiver, or a camera module of the electronic device 100.

Referring to FIG. 1 and FIG. 2, in some embodiments, when the electronic device 100 has a display function, the electronic device may further have a display screen 30, and the display screen 30 is mounted on the housing 10. The display screen 30 and the housing 10 jointly define the accommodating space. The display screen 30 may be electrically connected to the circuit board assembly 20, and can receive a control signal from the circuit board assembly 20 and display content accordingly.

Referring to FIG. 2, in some embodiments, the housing 10 may include a middle frame 12 and a rear cover 11 connected to each other, and the rear cover 11 is at the rear side of the middle frame 12. The display screen 30 is located in front of the middle frame 12. A circuit board assembly 20 may be arranged between the display screen 30 and the rear cover 11. In other embodiments, the housing 10 may be one-piece or split-type housing made of metal, plastic, or the like, and the implementation process may be the same or similar to the embodiments of this application.

Referring to FIG. 2, in some embodiments, the middle frame 12 may include a metal middle plate 121 and a frame 122 connected to each other. The frame 122 is disposed around the periphery of the metal middle plate 121, and the rear side of the metal middle frame 122 may be in seal fit with the edge of the rear cover 11. The metal middle plate 121 is located in front of the rear cover 11. A circuit board assembly 20 and a battery 40 may be disposed on the metal middle plate 121.

Figure 3:
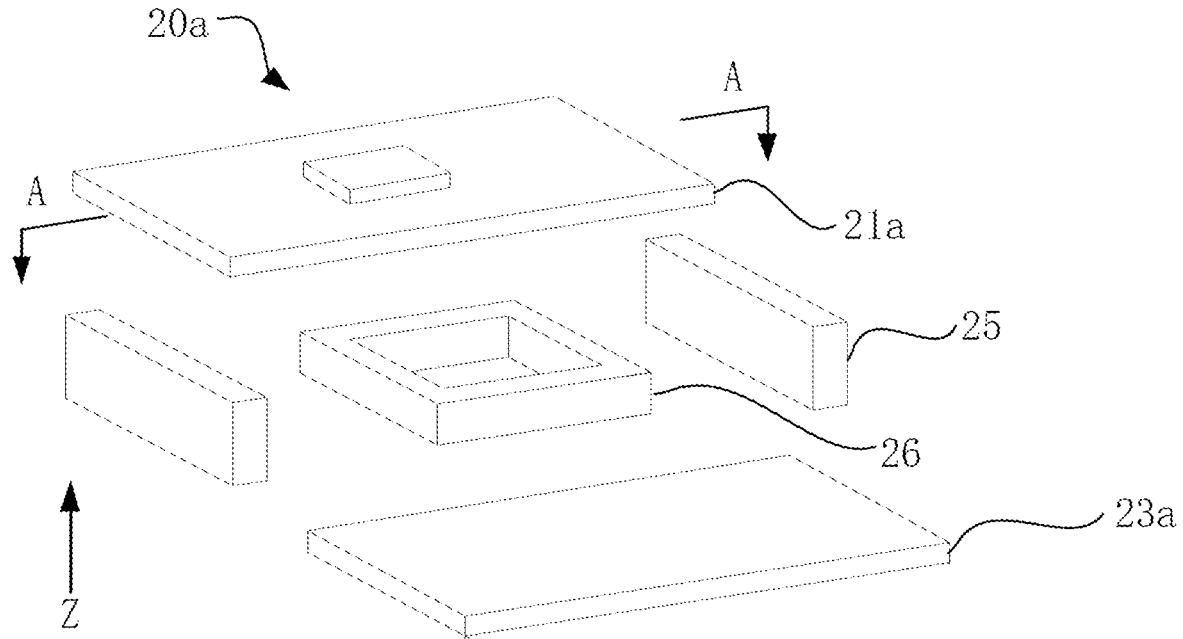
FIG. 3 is an exploded schematic structural diagram of a circuit board assembly in the related art.
Figure 4:
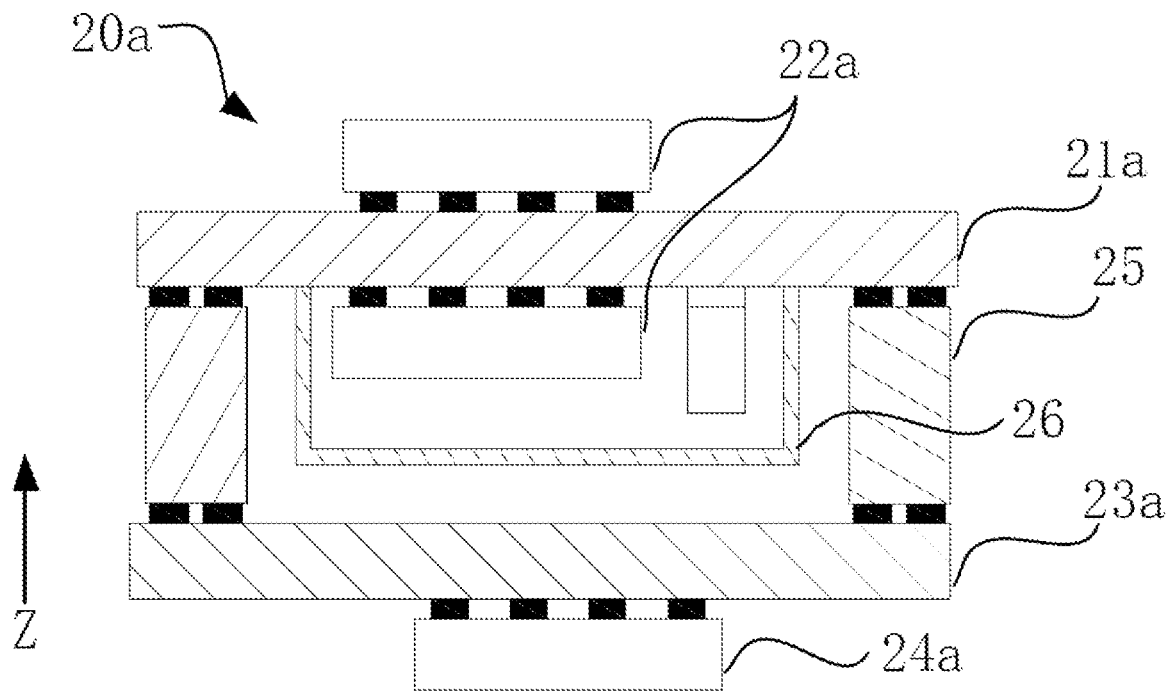
FIG. 4 is a schematic diagram of a cross-sectional structure of FIG. 3 taken along an A-A direction.

FIG. 3 is an exposed three-dimensional diagram of a circuit board assembly in the related art. FIG. 4 is a schematic diagram of a cross-sectional structure of FIG. 3 taken along an A-A direction. Arrows Z in FIG. 3 and FIG. 4 are used for indicating a vertical direction.

Referring to FIG. 3 and FIG. 4, in the related art, the circuit board assembly 20a includes: a plurality of stacked circuit boards. The plurality of circuit boards vertically stacked. For example, the circuit board assembly 20a includes: a first circuit board 21a and a second circuit board 23a stacked with the first circuit board 21a. The first circuit board 21a has a first surface and a second surface opposite to each other. The second circuit board 23a has a third surface and fourth surface opposite to each other. The second surface of the first circuit board 21a is disposed opposite to the third surface of the second circuit board 23a.

The first circuit board 21a is used for carrying a first component 22a. The first component 22a may be disposed on the first surface or the second surface of the first circuit board 21a. The first component 22a may alternatively be disposed on the first surface and the second surface of the first circuit board 21a. The first component 22a includes, but is not limited to, one or more of a system on a chip (system on a chip, SoC), a dynamic random access memory (such as a double data rate synchronous dynamic random access memory (double data rate synchronous dynamic random access memory, DDRSDRAM), a power management unit, a flash memory (flash memory, such as an embedded multimedia card, a universal flash storage (universal flash storage, UFS), or so like), a radio frequency (radio frequency, RF), and a power amplifier. The first component 22a may form an electrical connection with the first circuit board 21a through a welding process such as reflow welding.

The SoC may include one or more processing units. For example, the SoC may include an application processor (application processor, AP), a modem processor, a graphics processing unit (graphics processing unit, GPU), an image signal processor (image signal processor, ISP), a controller, a video codec, a digital signal processor (digital signal processor, DSP), a baseband processor, and/or a neural-network processing unit (neural-network processing unit, NPU), or so like. Different processing units may be independent components or may be integrated in one or more units.

The second circuit board 23a is used for carrying a second component 24a. The second component 24a may be disposed on the third surface or the fourth surface of the second circuit board 23a. The second component 24a may alternatively be disposed on the third surface and the fourth surface of the second circuit board 23a. The second component 24a includes, but is not limited to, one or more of a SoC, a dynamic random access memory, a power management unit, a flash memory chip, an RF, and a power amplifier. The second component 24a may form an electrical connection with the second circuit board 23a through a welding process such as reflow welding.

In some embodiments, the circuit board assembly 20a further includes: a connecting plate 25 that is connected between the first circuit board 21a and the second circuit board 23a. The connecting plate 25 an achieve not only a structural connection between the first circuit board 21a and the second circuit board 23a, but also an electrical connection between the first circuit board 21a and the second circuit board 23a. One or more connecting plates may be connected between the second circuit board 23a and the first circuit board 21a.

A signal transmitted by the connecting plate 25 includes, but is not limited to, one or more of a radio frequency signal, a ground signal, and a power signal. The radio frequency signal includes high frequency, very high frequency and super high frequency, with the frequency ranging from 300 kHz (kilohertz) to 300 GHz (gigahertz). For example, the first component 22a includes an RF, the second component 24a includes an SOC, and the connecting plate 25 is configured to transmit a radio frequency signal between the RF and the SOC.

For example, the connecting plate 25 includes a plate body, a signal transmission portion, and a grounding portion. One end of the plate body is connected to the first circuit board 21a, and the other end of the plate body is connected to the second circuit board 23a. The plate body is provided with a signal transmission hole and at least one grounding hole. The signal transmission hole extends from one end of the plate body to the other end of the plate body. The signal transmission portion is arranged in the signal transmission hole. The signal transmission portion connects the first circuit board 21a and the second circuit board 23a. The signal transmission portion is configured to transmit a signal between the first circuit board 21a and the second circuit board 23a. At least one grounding hole extends from one end of the plate body to the other end of the plate body, and extends along a same path as the signal transmission hole. At least one grounding hole surrounds the signal transmission hole and is spaced apart from the signal transmission hole. The grounding portion is arranged in at least one grounding hole. The grounding portion connects the first circuit board 21a and the second circuit board 23a. The grounding portion is configured to connect the ground of the first circuit board 21a and the ground of the second circuit board 23a. In this case, the first circuit board 21a, the grounding portion, and the second circuit board 23a achieve grounding continuity.

In some embodiments, the circuit board assembly 20a may further include a thermal radiation layer that is made of an interface material and configured to conduct heat generated by the first component 22a or the second component 24a to the outside, thereby achieving the purpose of reducing the temperature of the first component 22a or the second component 24a. The thermal radiation layer is, for example, a thermal conductive film made of a graphene material. The thermal radiation layer may be adhered to the surface of the first component 22a or the second component 24a. Taking the first component 22a as an example: when the first component 22a generates heat in operation, the heat may be conducted to the interface material, and the heat is conducted to the outside through thermal radiation of the interface material, thereby reducing the temperature of the first component 22a, protecting the first component 22a from overheating and damage, and further preventing the frequency of the first component 22a from decreasing due to overheating, and improving the performance of the first component 22a.

Referring to FIG. 3 and FIG. 4, the second surface of the first circuit board 21a is provided with a shielding case 26. The shielding case 26 may be a metal shielding case. The shielding case 26 is used for covering part of or all of the first component 22a mounted on the second surface. For example, the shielding case 26 is of a box structure with an opening. The box structure includes a frame body and a cover body, the cover body is connected to one end of the frame body, and an opening is provided at the other end of the frame body. The end of the frame body at which the opening is provided fits the first circuit board 21a. In this way, the shielding case 26 and the first circuit board 21a can define a closed shielding cavity, thereby suppressing the electromagnetic interference for the covered first component 22a. The shielding case 26 may be made of a lightweight sheet of aluminum, thereby reducing the overall weight of the circuit board assembly 20a.

Figure 5:
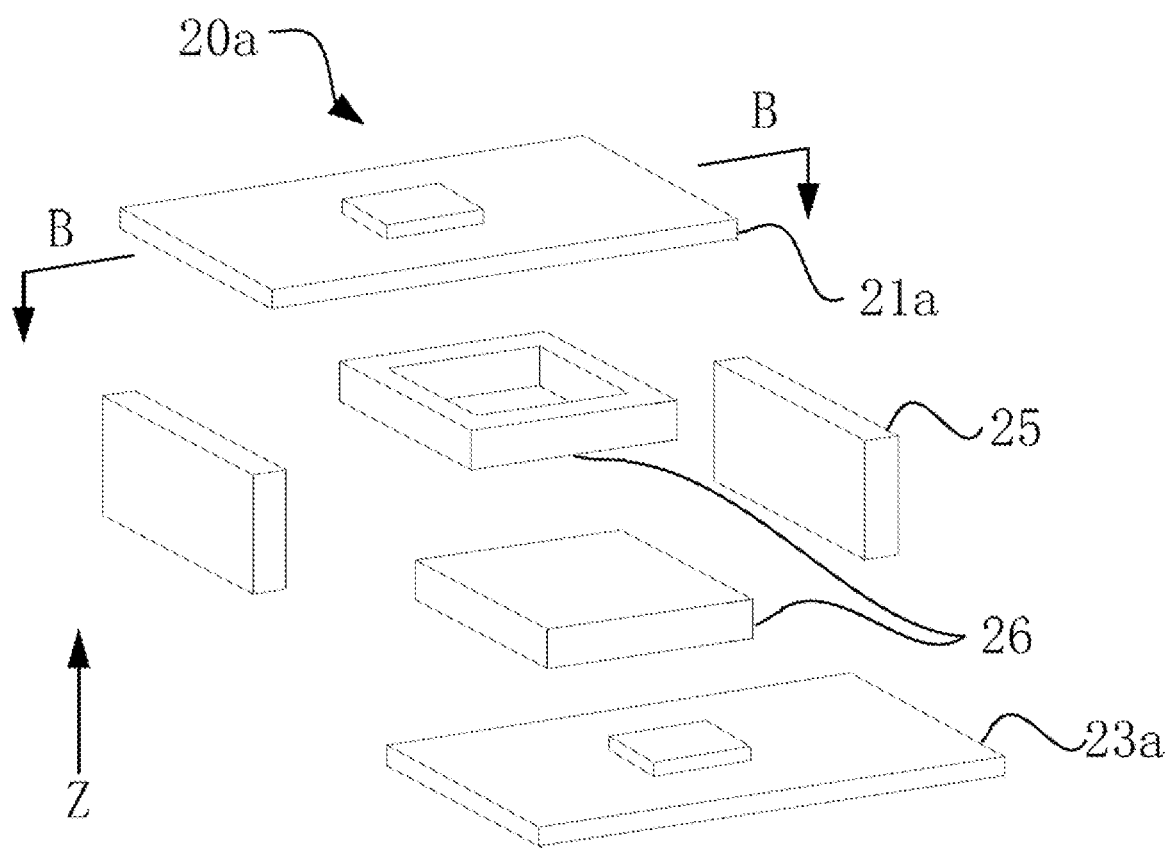
FIG. 5 is an exploded schematic structural diagram of another circuit board assembly in the related art.
Figure 6:
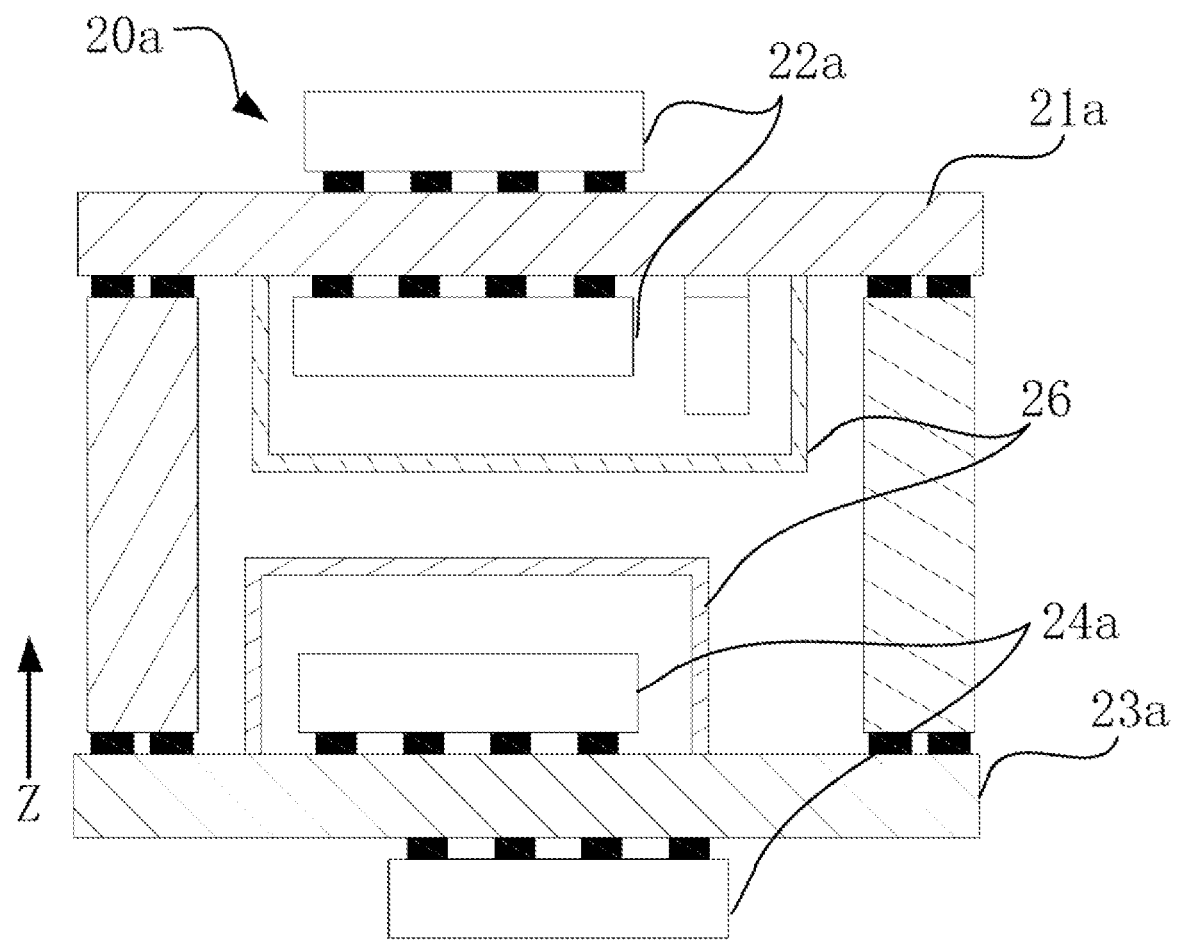
FIG. 6 is a schematic diagram of a cross-sectional structure of FIG. 5 taken along a B-B direction.

FIG. 5 is an exploded schematic structural diagram of another circuit board assembly in the related art. FIG. 6 is a schematic diagram of a cross-sectional structure of FIG. 5 taken along a B-B direction. Arrows Z in FIG. 5 and FIG. 6 are used for indicating a vertical direction.

Referring to FIG. 5 and FIG. 6, in the related art, in order to improve the layout density of components and further reduce the volume of the circuit board assembly 20a, the third surface of the second circuit board 23a may be provided with the second component 24a. Correspondingly, the third surface may further be provided with a shielding case 26. The shielding case 26 is used for covering part of or all of the second component 24a mounted on the third surface, thereby suppressing the electromagnetic interference for the covered second component 24a. The structure and material of the shielding case 26 on the third surface may be the same as or similar to those of the shielding case 26 on the second surface. There is a vertical gap between the shielding case 26 on the second surface and the shielding case 26 on the third surface, and the vertical gap allows for manufacturing tolerances, so as to reduce the difficulty of assembly. However, the added shielding case 26 on the third surface, and the vertical gap between the shielding cases 26 on the second surface and the third surface cause an increase in the vertical size of the circuit board assembly. As a result, the circuit board assembly 20a occupies a large vertical space, which is adverse to the lightweight design of the electronic device. Therefore, how to meet the electromagnetic shielding needs of the first component 22a and the second component 24a in a limited space is one of the problems to be solved urgently.

In order to overcome the foregoing problem, the embodiments of this application provide a circuit board assembly 20. Shielding frames on opposite surfaces of two adjacent circuit boards share a shared shielding cover, so that the electromagnetic shielding needs of components on the opposite surfaces of the two adjacent circuit boards can be satisfied, and it is also advantageous to reduce the vertical size of the circuit board assembly 20, and reduce the vertical space occupied by the circuit board assembly 20, thereby meeting the electromagnetic shielding needs of the components within a limited space.

Figure 7:
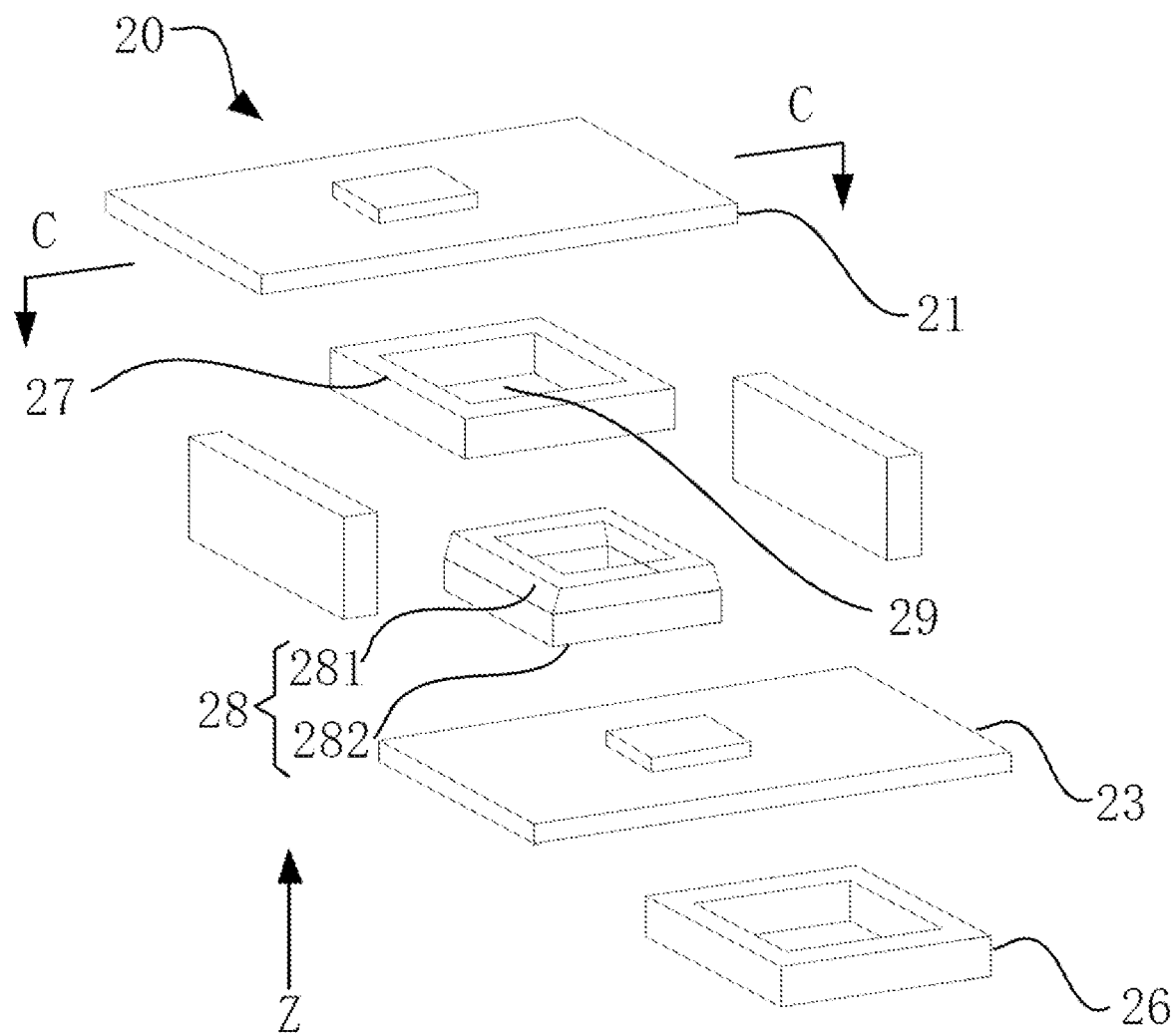
FIG. 7 is an exploded schematic structural diagram of a circuit board assembly according to an embodiment of this application.
Figure 8:
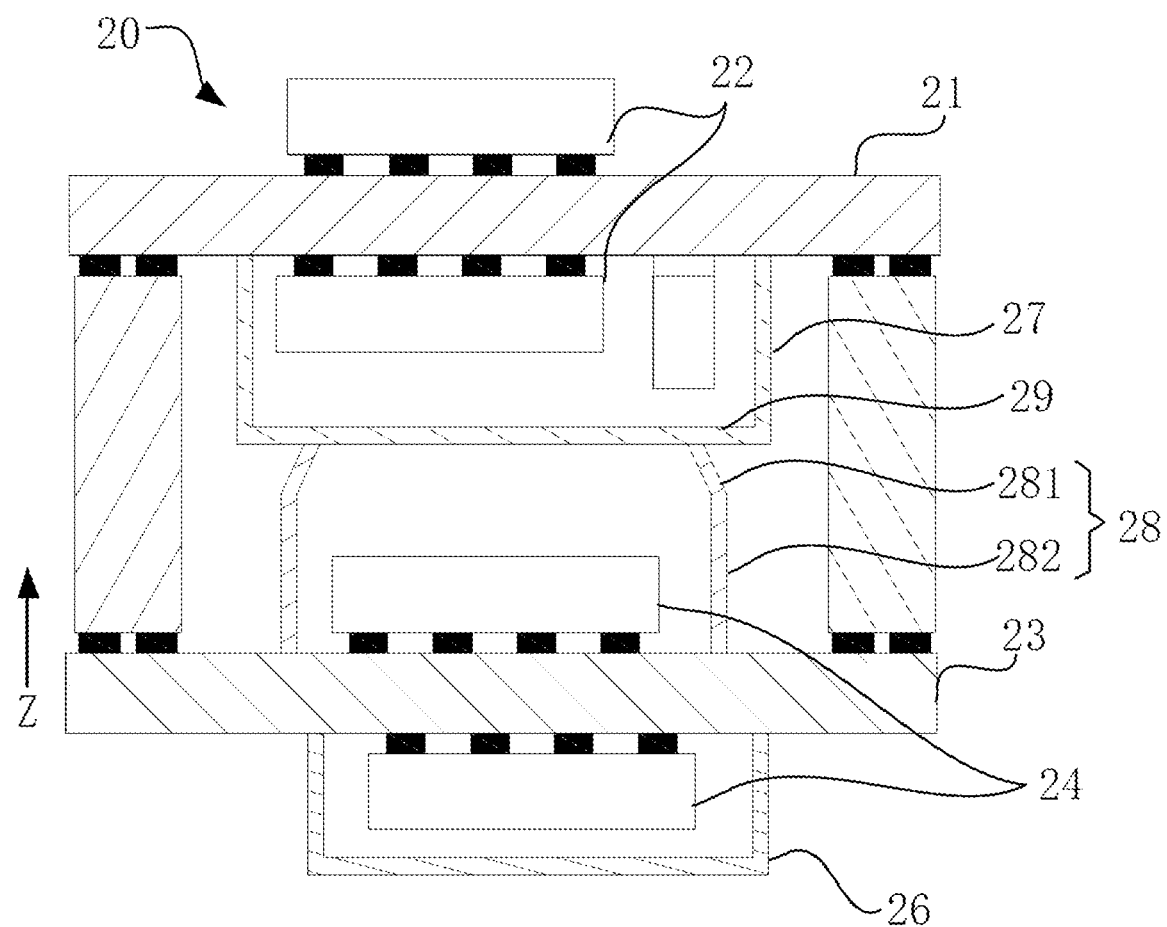
FIG. 8 is a schematic diagram of a cross-sectional structure of a circuit board assembly taken along a C-C direction in FIG. 7 according to an embodiment of this application.

FIG. 7 is an exploded schematic structural diagram of a circuit board assembly according to an embodiment of this application. FIG. 8 is a schematic diagram of a cross-sectional structure of a circuit board assembly taken along a C-C direction in FIG. 7 according to an embodiment of this application. Arrows Z in FIG. 7 and FIG. 8 are used for indicating a vertical direction.

Referring to FIG. 7 and FIG. 8, in some embodiments, a second surface of a first circuit board 21 is provided with a first shielding frame 27, a third surface of a second circuit board 23 is provided with a second shielding frame 28, and the first shielding frame 27 and the second shielding frame 28 share a shared shielding cover 29. The first circuit board 21, the first shielding frame 27, and the shared shielding cover 29 may define a shielding cavity for accommodating the first component 22, thereby suppressing electromagnetic interference for the first component 22; and the second circuit board 23, the second shielding frame 28, and the shared shielding cover 29 may be surrounded by a shielding cavity for accommodating the second component 24, thereby suppressing the electromagnetic interference for the accommodated second component 24. In this way, the first shielding frame 27 and the second shielding frame 28 share the shared shielding cover 29, which not only achieves electromagnetic interference suppression for the first component 22 and the second component 24 that are located on two opposite surfaces, but also saves the vertical space occupied by at least one shielding cover and the assembly gap. This helps reduce the vertical space occupied by the circuit board assembly 20, and is advantageous to the lightweight design of the electronic device, thereby meeting the electromagnetic shielding needs of the first component 22 and the second component 24 within a limited space.

The first shielding frame 27 may be prismatic, cylindrical, or conical. The second shielding frame 28 may be prismatic, cylindrical, or conical. The shape of the shared shielding cover 29 matches at least one of the first shielding frame 27 and the second shielding frame 28. For example, the first shielding frame 27 may be prismatic, the second shielding frame 28 may be prismatic, and the shared shielding cover 29 is of a polygonal plate-like structure. The first shielding frame 27 may be cylindrical, the second shielding frame 28 may be cylindrical, and the shared shielding cover 29 is of a circular plate-like structure.

One or more first shielding frames 27 may be provided. One or more second shielding frames 28 may be provided. One or more shared shielding covers 29 may be provided, and the quantity of shared shielding covers 29 may match a smaller one of the quantities of first shielding covers and second shielding covers. The quantity of first shielding frames 27 and the quantity of second shielding frames 28 may be specified according to actual needs. The quantity of first shielding frames 27 may or may not be equal to the quantity of second shielding frames 28.

For example, there may be a plurality of first shielding frames 27 and one second shielding frame 28, and one shared shielding cover 29 may be provided. There may be one first shielding frames 27 and a plurality of second shielding frames 28, and one shared shielding covers 29 may be provided. There may be a plurality of first shielding frames 27 and a plurality of second shielding frames 28, where the quantity of the first shielding frames 27 is less than the quantity of the second shielding frames 28, and the quantity of the shared shielding covers 29 may be less than or equal to the quantity of the first shielding frames 27. There may be a plurality of first shielding frames 27 and a plurality of second shielding frames 28, where the quantity of the second shielding frames 28 is less than the quantity of the first shielding frames 27, and the quantity of the shared shielding covers 29 may be less than or equal to the quantity of the second shielding frames 28.

In some examples, when the first component 22 on the first surface needs to be shielded, the shielding case 26 may be disposed at a corresponding position on the first surface. Alternatively, when the second component 24 on the fourth surface needs to be shielded, the shielding case 26 may be disposed at a corresponding position on the fourth surface. Alternatively, when a device on one surface requires electromagnetic shielding in corresponding regions of the second surface and the third surface, the shielding case 26 may be provided on the corresponding surface. For example, in the first component 22 arranged on the second surface and the second component 24 arranged at a corresponding position on the third surface, when only the first component 22 needs to be shielded, the shielding case 26 may be provided at the position of the first component 22.

In the embodiments of this application, the first shielding frame 27 and the second shielding frame 28 sharing the shared shielding cover 29 may be implemented in many manners. For example, the shared shielding cover 29 may be connected to the first shielding frame 27 in a non-detachable manner, and the shared shielding cover 29 is detachably connected to the second shielding frame 28. Alternatively, the shared shielding cover 29 may be detachably connected to the first shielding frame 27, and the shared shielding cover 29 is connected to the second shielding frame 28 in a non-detachable manner. Alternatively, the shared shielding cover 29 may be detachably connected to the first shielding frame 27 and the second shielding frame 28. Alternatively, the shared shielding cover 29 may be connected to the first shielding frame 27 and the second shielding frame 28 in a non-detachable manner. The detachable connection includes at least one of the following: abutment, clamping and plugging. The non-detachable connection includes at least one of the following: integral forming, or bonding by a welding machine. Definitely, the detachable connection and the non-detachable connection are not limited thereto, and this embodiment merely shows an example for illustration.

In addition, it should be noted that: the quantity of circuit boards in the circuit board assembly is not limited to two, and the quantity of circuit boards in the circuit board assembly may be more than two. The specific quantity of circuit boards is not limited in the embodiments of this application.

For ease of description, the embodiments of this application and the corresponding drawings take two circuit boards as an example. When the quantity of circuit boards in the circuit board assembly is more than two, one of two circuit boards adjacent to each other may be the first circuit board and the other is the second circuit board. When the quantity of circuit boards in the circuit board assembly is more than two, the implementation process thereof is similar to this embodiment of this application. Details are not described again in this embodiment.

For example, the circuit board assembly may include three circuit boards stacked vertically in sequence, the top and bottom circuit boards may be first circuit boards, and the circuit board located in the middle may be a second circuit board, that is, the three circuit boards may be: a first circuit board, a second circuit board, and a first circuit board in sequence from top to bottom. In another example, the circuit board assembly may include four circuit boards stacked vertically in sequence, and the four circuit boards may be: a first circuit board, a second circuit board, a first circuit board, and a second circuit board in sequence from top to bottom. In further another example, the circuit board assembly may include three circuit boards stacked vertically in sequence, and the three circuit boards may alternatively be: a second circuit board, a first circuit board, and a second circuit board in sequence from top to bottom. It can be understood that, the layout of the circuit boards in the circuit board assembly is not limited thereto, and this embodiment merely shows an example for description.

The implementation of the first shielding frame 27 and the second shielding frame 28 sharing the shared shielding cover 29 is described in detail below in conjunction with the accompanying drawings.

Referring to FIG. 7 and FIG. 8, in a possible implementation, in order to achieve both the assembly efficiency and assembly flexibility, the shared shielding cover 29 may be connected to the first shielding frame 27 in a non-detachable manner; and the shared shielding cover 29 may abut against the second shielding frame 28. The second shielding frame 28 has a shielding frame body 282 and an elastic abutment portion 281, and the elastic abutment portion 281 is disposed at an end of the shielding frame body 282 that faces toward the shared shielding cover 29. The second shielding frame 28 may abut against the shared shielding cover 29 through the elastic abutment portion 281. The elastic abutment portion 281 may abut against a surface of the shared shielding cover 29 that faces toward the second shielding frame 28. The elastic abutment portion 281 may be made of an elastic material having an electromagnetic shielding effect. The elastic abutment portion 281 and the shielding frame body 282 may be integrally formed, or welded or plugged together.

The elastic abutment portion 281 may be tilted relative to the shielding frame body 282, and tilted toward the interior of the shielding cavity, so as to reduce the space occupied by the second shielding frame 28. Definitely, the elastic abutment portion 281 may be tilted relative to the shielding frame body 282 toward the outside of the shielding cavity; alternatively, the elastic abutment portion 281 and the shielding frame body 282 are both arranged vertically.

In this way, when the second shielding frame 28 is assembled with the shared shielding cover 29, the shared shielding cover 29 exerts a certain force on the elastic abutment portion 281, and the elastic abutment portion 281 stores elastic potential energy under the force. Under the action of the elastic potential energy, the elastic abutment portion 281 can be tightly pressed against the surface of the shared shielding cover 29, which helps ensure the connection reliability between the second shielding frame 28 and the shared shielding cover 29.

Figure 17:
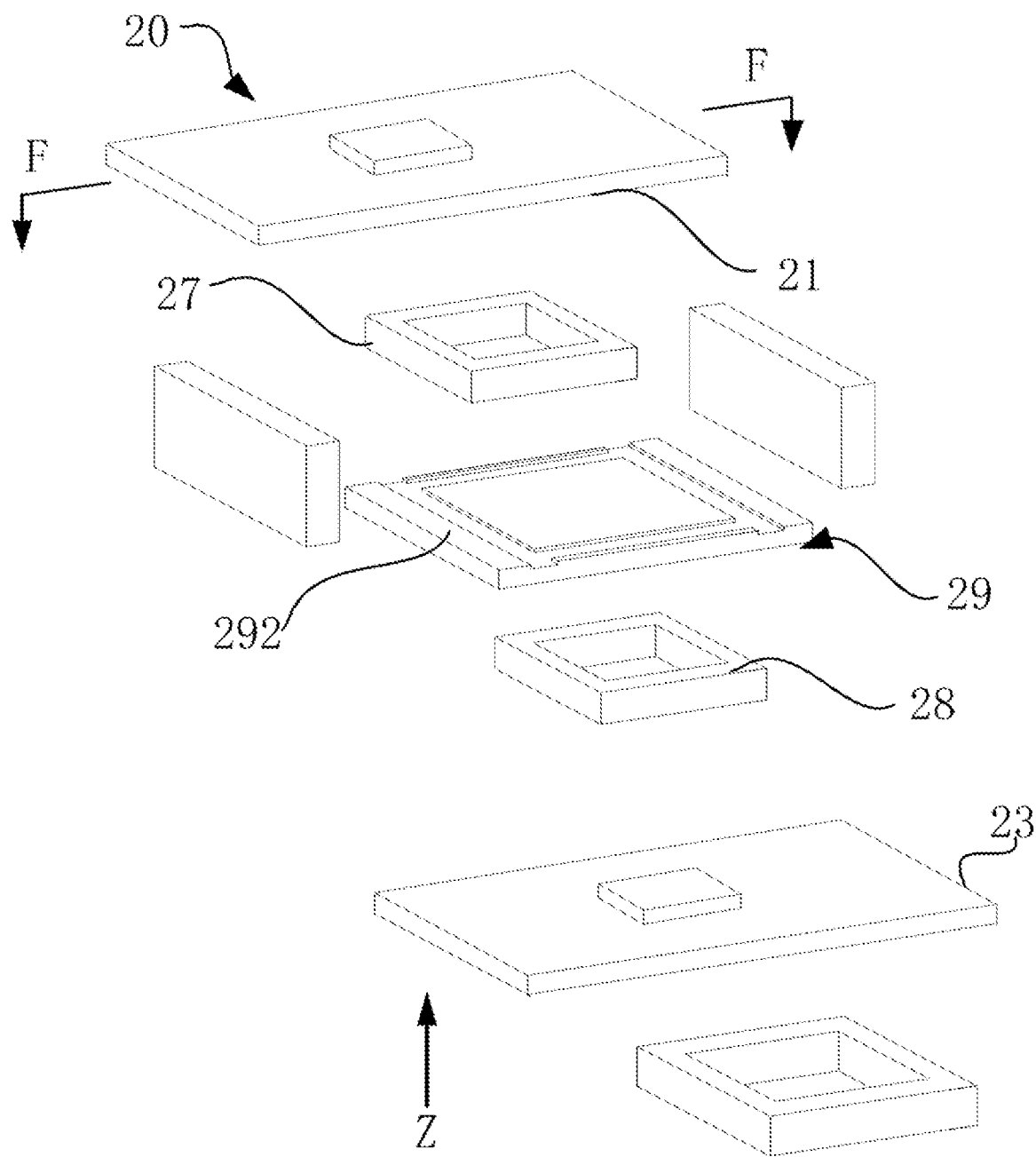
FIG. 17 is an exploded schematic structural diagram of a circuit board assembly according to further another embodiment of this application.

In some examples, the elastic abutment portion 281 may include a plurality of elastic plates. As shown in FIG. 17, the plurality of elastic plates may be connected to form a closed ring structure, so that the second shielding frame 28, the shared shielding cover 29 and the second circuit board 23 define a closed shielding cavity. Alternatively, the plurality of elastic plates are located at an end of the shielding frame body 282 that faces toward the shared shielding cover 29 and are arranged on two opposite end surfaces.

In this way, when the second shielding frame 28 is assembled with the shared shielding cover 29, the shared shielding cover 29 exerts a certain force on the elastic plates. Under the force, the elastic plates are elastically deformed and store elastic potential energy. Under the action of the elastic potential energy, the elastic plates can be tightly pressed against the surface of the shared shielding cover 29, which helps ensure the connection reliability between the second shielding frame 28 and the shared shielding cover 29.

In order to avoid the deviation of the second shielding frame 28 relative to the shared shielding cover 29, the surface of the shared shielding cover 29 may be provided with a groove, and the elastic abutment portion 281 fits the groove to achieve a limiting effect to avoid the deviation of the second shielding frame 28 relative to the shared shielding cover 29.

In other examples, the elastic abutment portion 281 may alternatively include an elastic protrusion and a spring that abuts between the elastic protrusion and the shielding frame body 282. In this way, when the second shielding frame 28 is assembled with the shared shielding cover 29, under the force exerted by the shared shielding cover 29, the spring is compressed and stores elastic potential energy. Under the action of the elastic potential energy, the elastic protrusion can be tightly pressed against the surface of the shared shielding cover 29. The elastic protrusion may be hemispherical, cylindrical, or tapered. The layout of the elastic protrusion may be similar to that of the elastic plate, which is not described again herein.

In other examples, the elastic abutment portion 281 may alternatively include a torsion spring, where one end of the torsion spring is connected to the shielding frame body 282, and the other end of the torsion spring is used for abutting against the surface of the shared shielding cover 29. In this way, when the second shielding frame 28 is assembled with the shared shielding cover 29, under the force exerted by the shared shielding cover 29, the torsion spring generates torque and stores potential energy, so that the torsion spring can be tightly pressed against the surface of the shared shielding cover 29. The layout of the torsion spring may be similar to the layout of the elastic plate, which is not described again herein.

In other embodiments, the elastic abutment portion 281 may alternatively be located on the outer periphery of the first shielding frame 27, and the elastic abutment portion 281 may abut against the outer surface of the first shielding frame 27 that is away from the shielding cavity.

In some other embodiments, the shared shielding cover 29 may be connected to the second shielding frame 28 in a non-detachable manner. The first shielding frame 27 may abut against the shared shielding cover 29 or the second shielding frame 28. The implementation of this embodiment may be similar to the foregoing embodiments.

Figure 9:
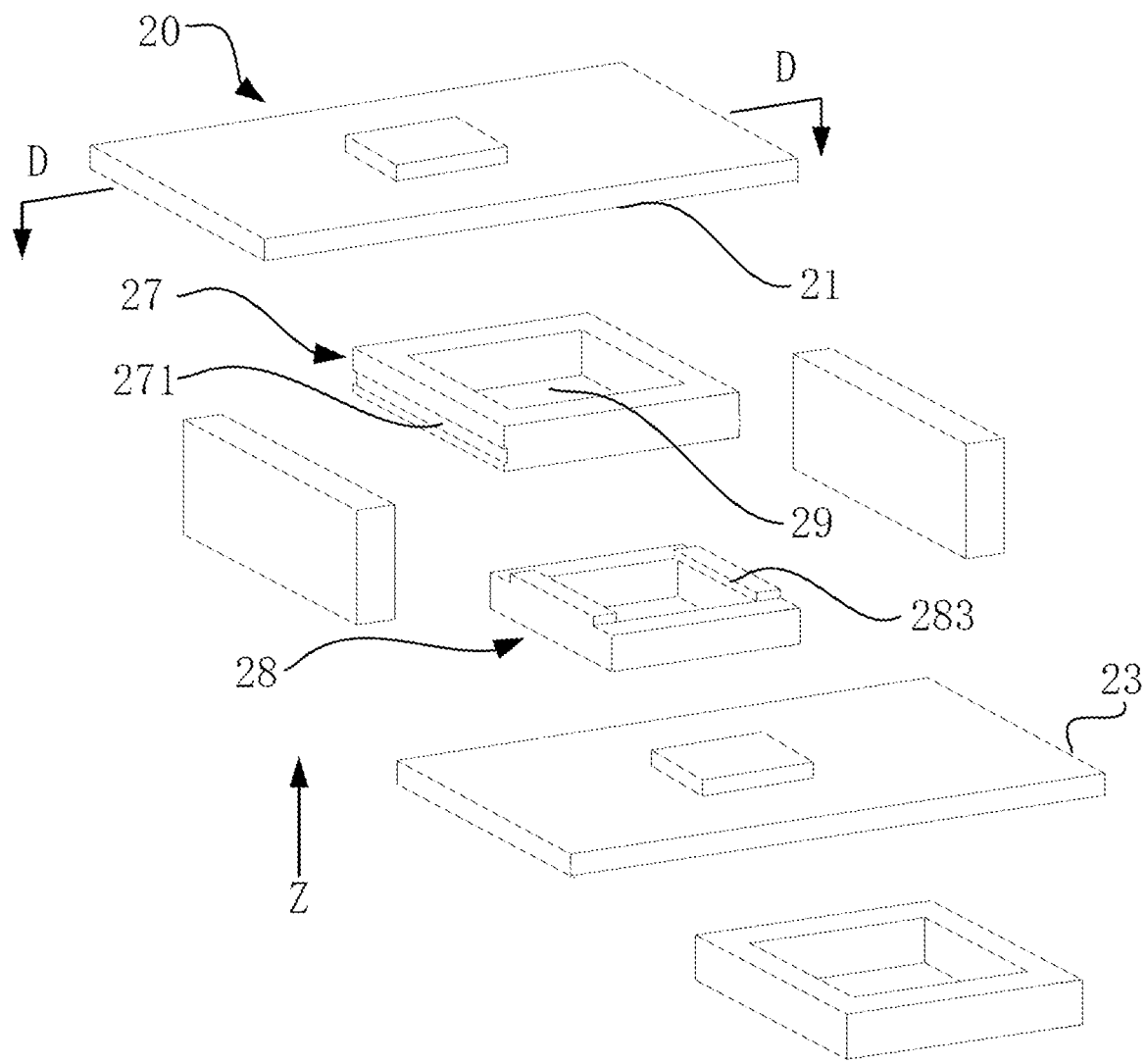
FIG. 9 is an exploded schematic diagram of a circuit board assembly according to another embodiment of this application.
Figure 10:
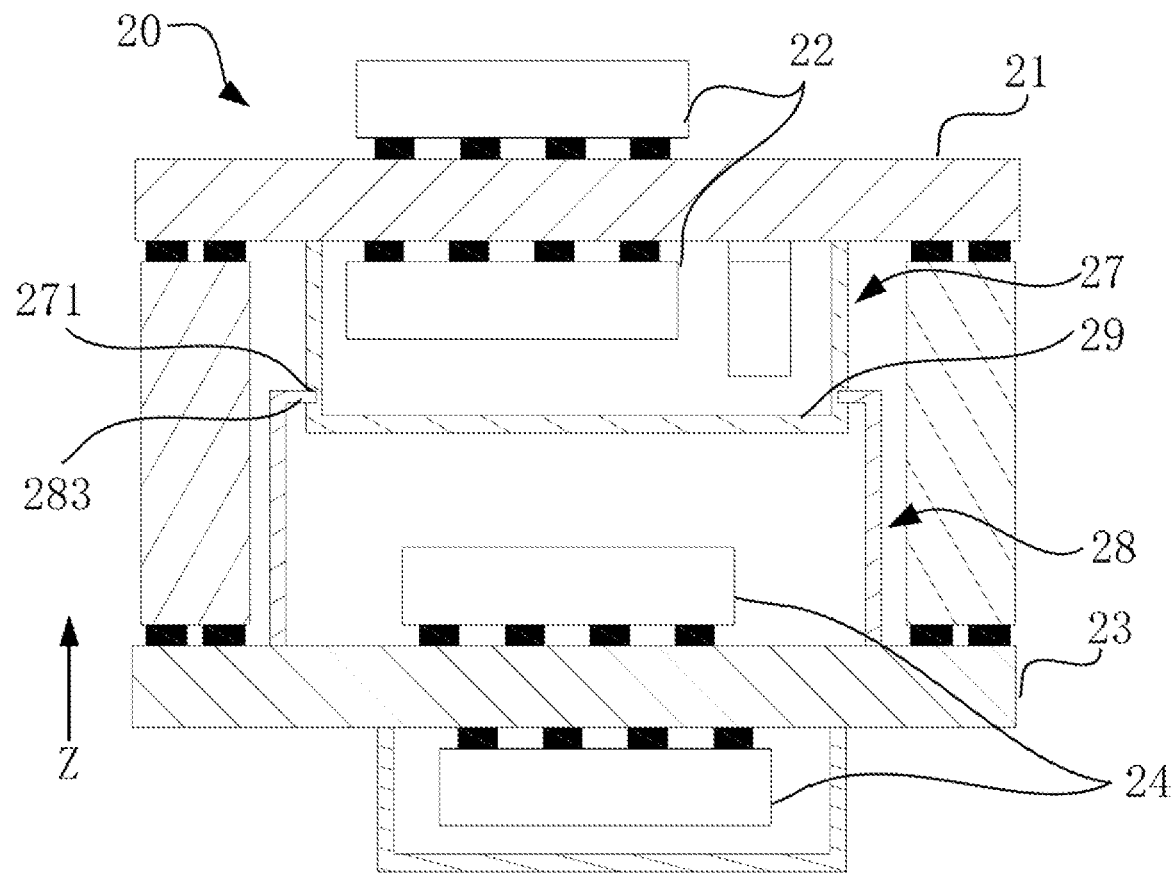
FIG. 10 is a schematic diagram of a cross-sectional structure of a circuit board assembly taken along a D-D direction in FIG. 9 according to an embodiment of this application.

FIG. 9 is an exploded schematic structural diagram of a circuit board assembly according to another embodiment of this application. FIG. 10 is a schematic diagram of a cross-sectional structure of a circuit board assembly taken along a D-D direction in FIG. 9 according to an embodiment of this application. Arrows Z in FIG. 9 and FIG. 10 are used for indicating a vertical direction.

Referring to FIG. 9 and FIG. 10, in a possible implementation, the second shielding frame 28 is inserted on an outer side at an end, which is close to the shared shielding cover 29, of the first shielding frame 27. An outer surface of the first shielding frame 27 is provided with a first clamping slot 271, and the second shielding frame 28 is provided with a first protrusion portion 283. In this way, the second shielding frame 28 is clamped with the first shielding frame 27 through fitting between the first protrusion portion 283 and the first clamping slot 271, thereby detachably connecting the second shielding frame 28 to the shared shielding cover 29.

The shared shielding cover 29 may be connected to the first shielding frame 27 in a non-detachable manner. The first clamping slot 271 is disposed in a region, which is close to the shared shielding cover 29, on the outer surface of the first shielding frame 27, to further reduce the occupied space.

As shown in FIG. 9, some of the outer surfaces of the first shielding frame 27 are provided with the first clamping slots 271. For example, two opposite outer surfaces of the first shielding frame 27 are provided with the first clamping slots 271, and correspondingly, the corresponding two surfaces of the second shielding frame 28 are provided with the first protrusion portions 283, so as to reduce the difficulty of assembly.

Figure 11:
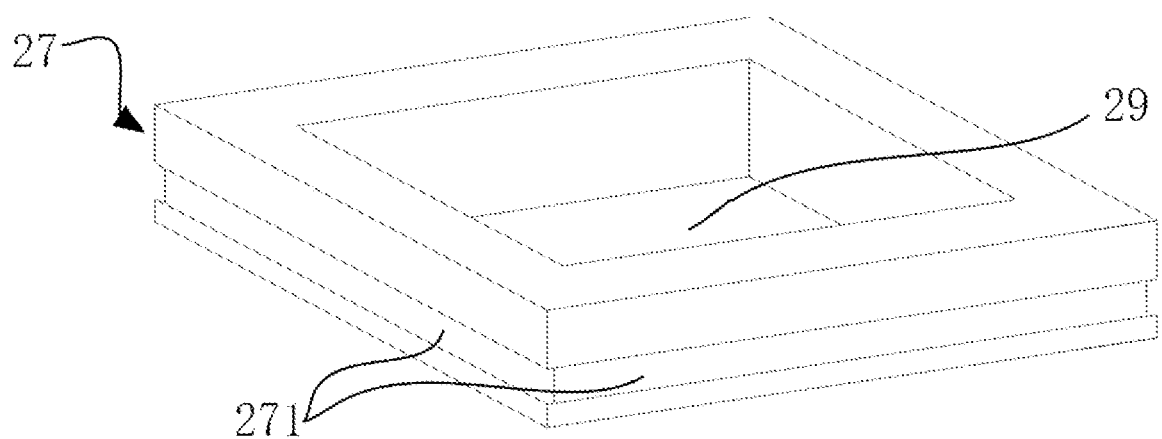
FIG. 11 is a schematic structural diagram of a first shielding frame and a shared shielding cover according to an embodiment of this application.

FIG. 11 is a schematic structural diagram of a first shielding frame and a shared shielding cover according to an embodiment of this application. Referring to FIG. 11, all the outer surfaces of the first shielding frame 27 may be provided with the first clamping slots 271. Two opposite surfaces of the second shielding frame 28 may be provided with the first protrusion portions 283 to reduce the difficulty of assembly. Alternatively, all the outer surfaces of the second shielding frame 28 may be provided with the first protrusion portions 283 to define a more closed shielding cavity.

As shown in FIG. 9 and FIG. 11, the first clamping slot 271 may include a strip-shaped blind hole structure, and the blind hole structure extends along a circumferential direction of the first shielding frame 27. Each outer surface of the first shielding frame 27 may be provided with one first clamping slot 271. Definitely, each outer surface of the first shielding frame 27 may be provided with a plurality of first clamping slots 271 that arranged in parallel at intervals, and the first protrusion portion 283 may fit one of the plurality of first clamping slots 271 of the same outer surface. As shown in FIG. 11, all outer surfaces of the first shielding frame 27 are provided with the first clamping slots 271, and the first clamping slots 271 on adjacent outer surfaces are communicated.

Correspondingly, the first protrusion portion 283 may include a strip-shaped rib. At least some of the surfaces of the second shielding frame 28 may be provided with ribs to correspond to at least some of the plurality of first clamping slots 271. Alternatively, the first protrusion portion 283 may include a clamping block. There may be a plurality of clamping blocks arranged at intervals. The clamping blocks may be disposed on at least some of the surfaces of the second shielding frame 28 to correspond to at least some of the plurality of first clamping slots 271.

Figure 12:
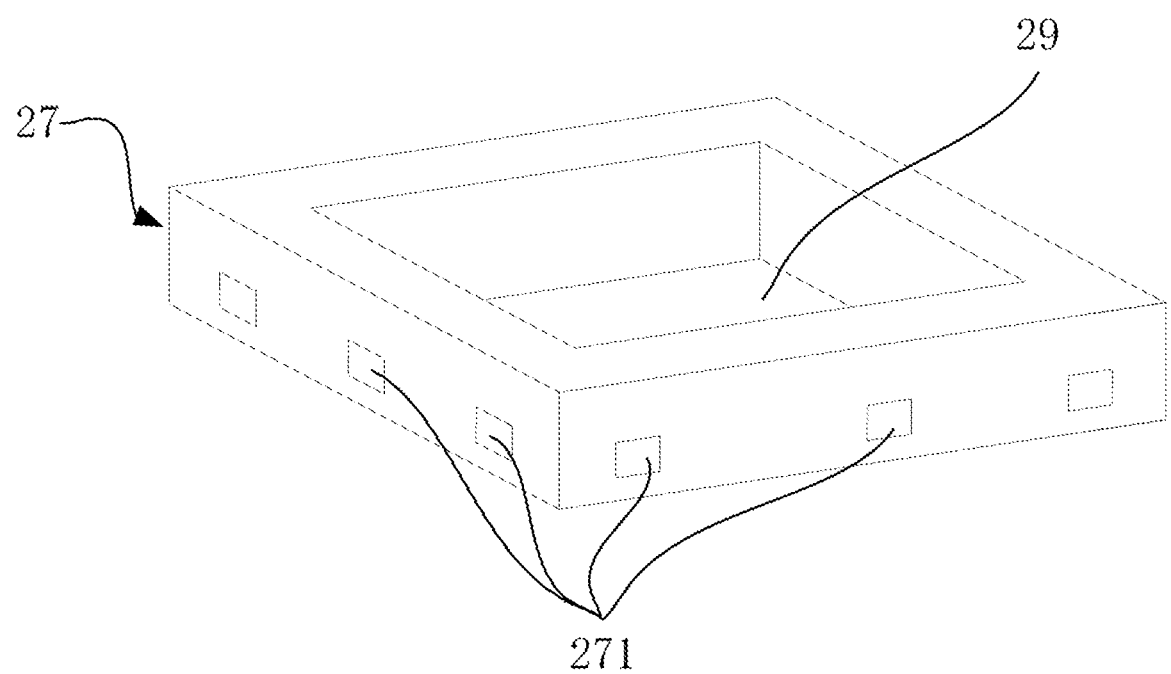
FIG. 12 is a schematic structural diagram of a first shielding frame and a shared shielding cover according to another embodiment of this application.

FIG. 12 is a schematic structural diagram of a first shielding frame and a shared shielding cover according to another embodiment of this application. Referring to FIG. 12, the first clamping slot 271 may include a rectangular blind hole structure, or a circular blind hole structure. There is a plurality of first clamping slots 271 uniformly distributed at intervals. Each outer surface of the first shielding frame 27 may be provided with a plurality of first clamping slots 271 distributed at intervals. The plurality of first clamping slots 271 may be distributed in one row or a plurality of rows. Correspondingly, the first protrusion portion 283 may include a clamping block. There may be a plurality of clamping blocks, and the plurality of clamping blocks are spaced apart. The clamping blocks may be disposed corresponding to at least some of the plurality of first clamping slots 271.

In some examples, in a direction toward the first clamping slot 271, the vertical dimension of at least part of the cross section of the first protrusion portion 283 along the D-D direction is gradually reduced to form a first guiding surface. For example, the cross section of the first protrusion portion 283 in the D-D direction may be hemispherical, trapezoidal, or triangular. This helps the first protrusion portion 283 to enter the first clamping slot 271, thereby improving the assembly efficiency. Definitely, the cross section of the first clamping slot 271 in the D-D direction may be rectangular.

In other examples, in order to help the first protrusion portion 283 to enter the first clamping slot 271 and improve the assembly efficiency, in the direction toward the first protrusion portion 283, the vertical dimension of at least part of the cross section of the first clamping slot 271 along the D-D direction may be gradually increased, for example, at least part of the cross section of the first clamping slot 271 along the D-D direction may be trapezoidal or hemispherical. Definitely, the cross section of the first protrusion portion 283 along the D-D direction may also be rectangular.

Figure 13:
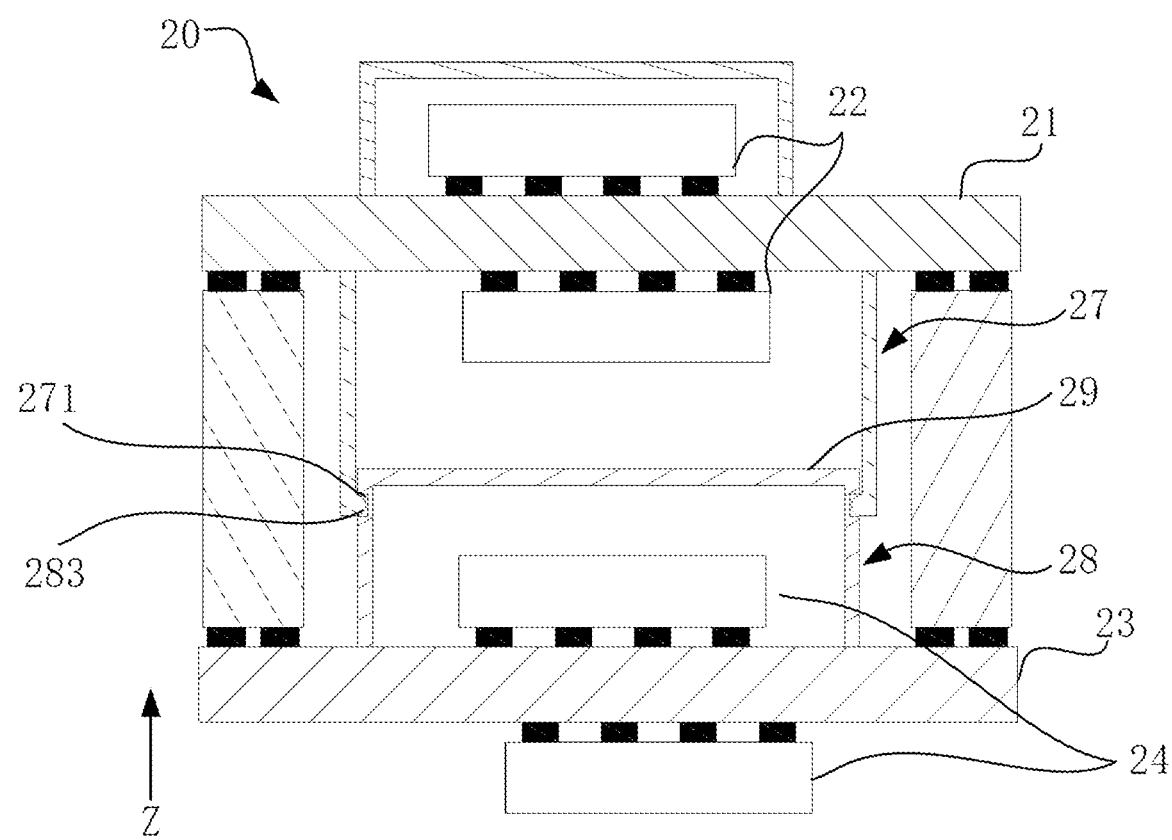
FIG. 13 is a schematic diagram of a cross-sectional structure of a circuit board assembly according to another embodiment of this application.

FIG. 13 is a schematic diagram of a cross-sectional structure of a circuit board assembly according to another embodiment of this application, and the arrow Z in FIG. 13 is used for indicating a vertical direction. For the cross-sectional direction of FIG. 13, refer to the D-D direction in FIG. 9.

Referring to FIG. 13, in some embodiments, an outer surface of the first shielding frame 27 may be provided with a first protrusion portion 283, and the second shielding frame 28 may be provided with a first clamping slot 271. The shared shielding cover 29 may be connected to the second shielding frame 28 in a non-detachable manner. The structure and layout of the first clamping slot 271 may be the same as or similar to those in the foregoing embodiment, and the structure and layout of the first protrusion portion 283 may be the same as or similar to those in the foregoing embodiment. Details are not described again herein.

Figure 14:
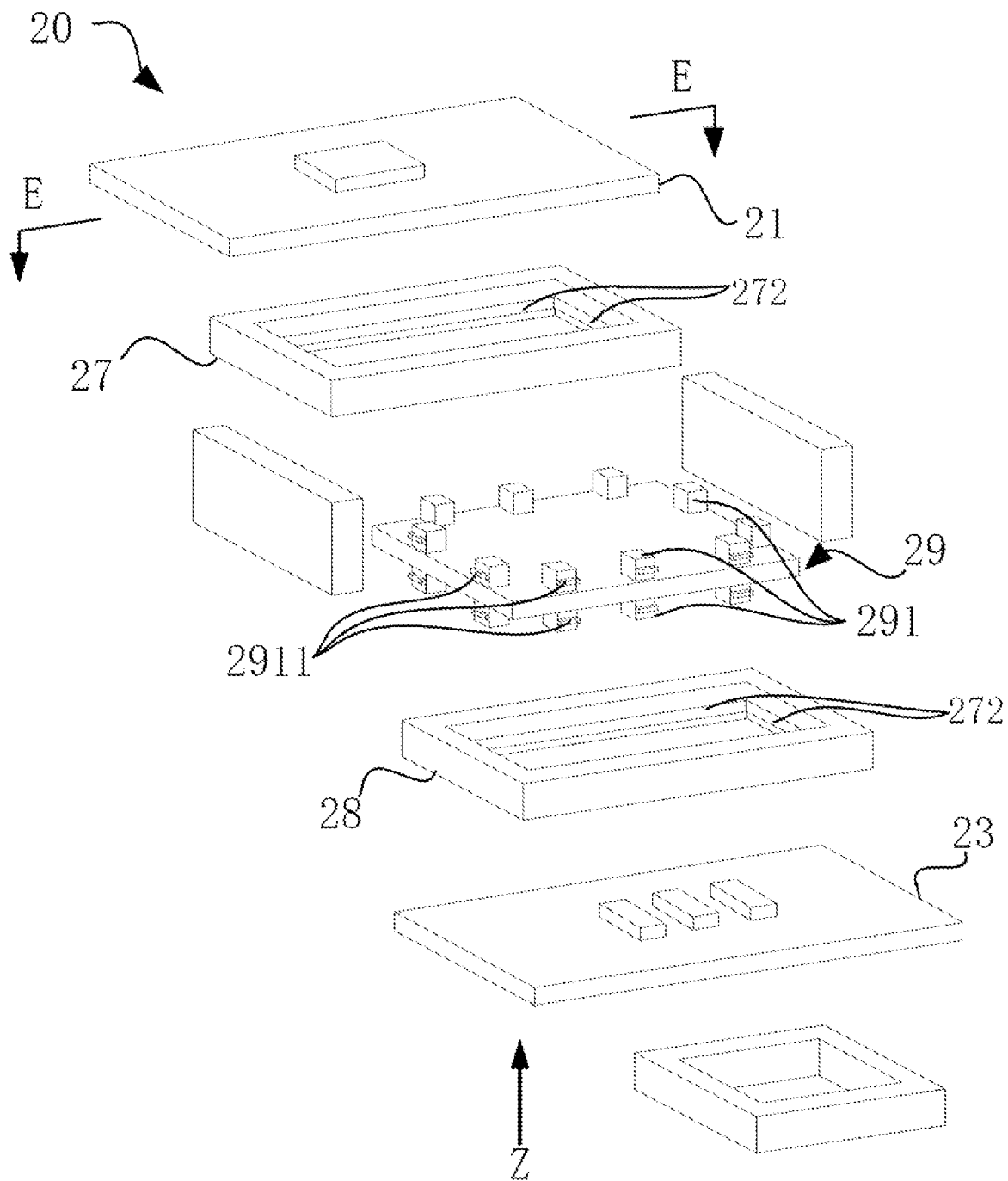
FIG. 14 is an exploded structural schematic diagram of a circuit board assembly according to further another embodiment of this application.
Figure 15:
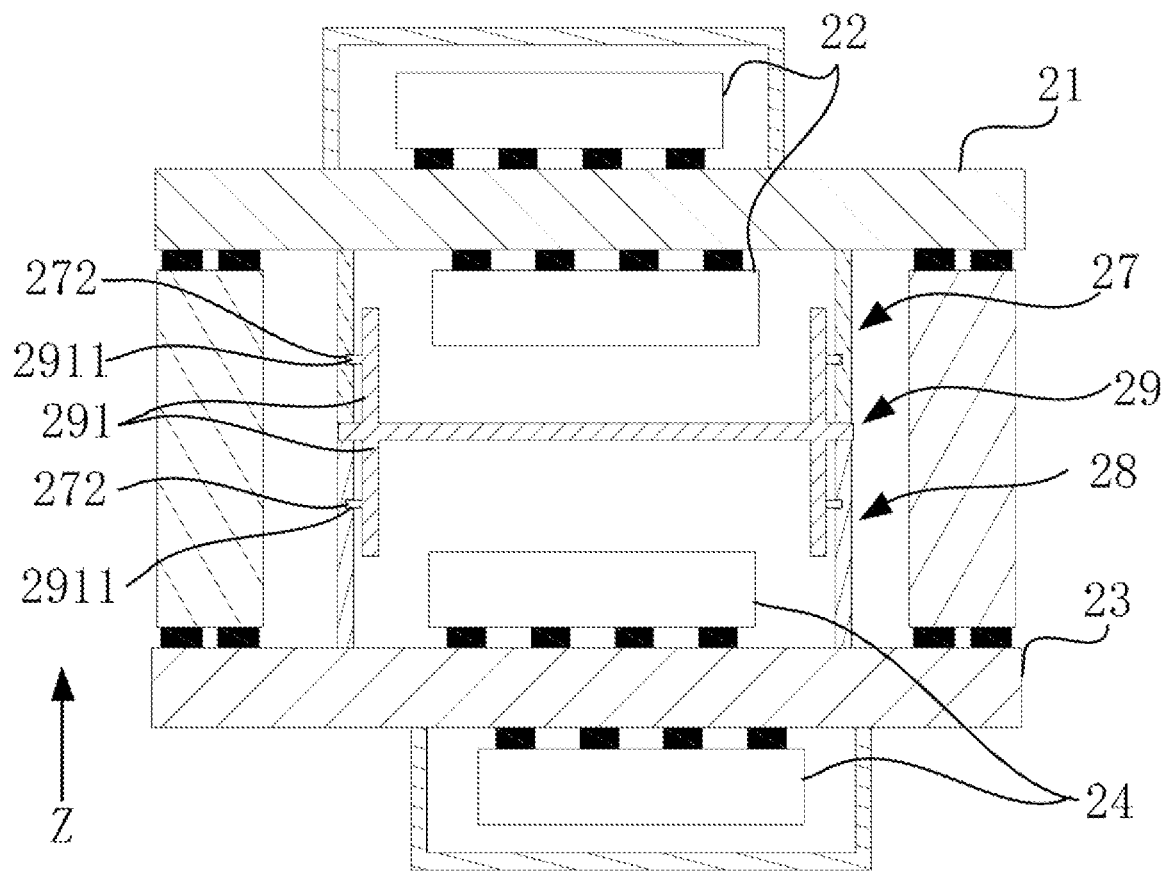
FIG. 15 is a schematic diagram of a cross-sectional structure of a circuit board assembly taken along an E-E direction in FIG. 14 according to an embodiment of this application.

FIG. 14 is an exploded schematic structural diagram of a circuit board assembly according to further another embodiment of this application. FIG. 15 is a schematic diagram of a cross-sectional structure of a circuit board assembly taken along an E-E direction in FIG. 14 according to an embodiment of this application Arrows Z in FIG. 14 and FIG. 15 are used for indicating a vertical direction.

Referring to FIG. 14 and FIG. 15, in a possible implementation, a plurality of columns 291 may be disposed on a surface of the shared shielding cover 29 that faces toward the first shielding frame 27, and the plurality of columns 291 on the surface are clamped with the first shielding frame 27. A plurality of columns 291 may be disposed on a surface of the shared shielding cover 29 that faces toward the second shielding frame 28, and the plurality of columns 291 on the surface are clamped with the second shielding frame 28. In this way, when the first shielding frame 27 and second shielding frame 28 are assembled with the shared shielding cover 29, it is less difficult to clamp the first shielding frame 27 and second shielding frame 28 with the plurality of columns 291, thereby improving the assembly efficiency.

The column 291 may be a cylinder or a prism. A plurality of columns 291 located at the same edge may be arranged at interval. The plurality of columns 291 located at the same edge may be evenly distributed. The columns 291 on the surface of the shared shielding cover 29 that faces toward the first shielding frame 27 may be opposite to or staggered from the columns 291 on the surface of the shared shielding cover 29 that faces toward the second shielding frame 28.

In general, the height of the column 291 in the vertical direction may be equal to or less than the height of the corresponding shielding frame, so that the first shielding frame 27 is in contact with the second surface of the first circuit board 21 and the surface of the shared shielding cover 29 to form a relatively closed shielding cavity, and the second shielding frame 28 is in contact with the third surface of the second circuit board 23 and the surface of the shared shielding cover 29 to form a relatively closed shielding cavity.

During assembly, the columns 291 on the surface of the shared shielding cover 29 that faces toward the first shielding frame 27 may be in contact with the second surface of the first circuit board 21, and the columns 291 on the surface of the shared shielding cover 29 that faces toward the second shielding frame 28 may be in contact with the third surface of the second circuit board 23, so that the columns 291 can further achieve a support function. Alternatively, the columns 291 on the surface of the shared shielding cover 29 that faces toward the first shielding frame 27 may be spaced apart from the second surface of the first circuit board 21, and the columns 291 on the surface of the shared shielding cover 29 that faces toward the second shielding frame 28 may be spaced apart from the third surface of the second circuit board 23.

In some embodiments, a surface of the column 291 may be provided with a second protrusion portion 2911; the first shielding frame 27 and the second shielding frame 28 may be each provided with a second clamping slot 272 that fits the second protrusion portion 2911.

The second protrusion portion 2911 may be a strip-shaped rib, and the rib may extend in a direction parallel to a surface of the shared shielding cover 29. Taking the column 291 being quadrangular as an example, the column 291 is provided with a second protrusion portion 2911 on a surface that faces toward the first shielding frame 27 or the second shielding frame 28, and the second protrusion portion 2911 extends to two surfaces adjacent to the current surface. Definitely, in other examples, the second protrusion portion 2911 may alternatively be a block-shaped or hemispherical protrusion structure.

The second protrusion portion 2911 may have a second guiding surface used for guiding the second protrusion portion 2911 into the corresponding second clamping slot 272. The second guiding surface may be an oblique surface or a curved surface.

The arrangement position of the second clamping slot 272 matches the second protrusion portion 2911. On inner surfaces that faces toward the columns 291, the first shielding frame 27 and the second shielding frame 28 are provided with second clamping slots 272 in regions corresponding to the second protrusion portions 2911.

In some examples, the second clamping slot 272 may be a strip-shaped blind hole structure. The length direction of the second clamping slot 272 may extend along an arrangement direction of the second protrusion portions 291 on the same edge. Taking the first shielding frame 27 being quadrilateral as an example, the second clamping slot 272 is provided on the surface of the first shielding frame 27 that faces toward the columns 291 and extends to two surfaces adjacent to the current surface. All the second protrusion portions 291 on the same edge can fit the strip-shaped second clamping slot 272. In this way, even if a manufacturing error occurs, the second protrusion portion 291 can fit the second clamping slot 272 smoothly, making it less difficult to clamp the first shielding frame 27 and the second shielding frame 28 with the plurality of columns 291.

In other examples, the second clamping slot 272 may be a rectangular blind hole structure, or a circular blind hole structure. A plurality of second clamping slots 272 are uniformly distributed at intervals, and the arrangement positions and quantity of the second clamping slots 272 match the second protrusion portions 2911. In the specific implementation, the size of the second clamping slot 272 may be slightly larger than the size of the second protrusion portion 291, to allow for manufacturing errors, thereby making it less difficult to clamp the first shielding frame 27 and the second shielding frame 28 with the plurality of columns 291.

The second clamping slot 272 is only required to have a shape that can accommodate a matching second protrusion portion 2911. For example, referring to FIG. 15, when the cross section of the second protrusion portion 2911 along the E-E direction is hemispherical, the cross section of the second clamping slot 272 along the E-E direction may be hemispherical, or the cross section of the second clamping slot 272 along the E-E direction may be polygonal. When the cross section of the second protrusion portion 2911 along the E-E direction is polygonal, the cross section of the second clamping slot 272 along the E-E direction may be polygonal or hemispherical.

In other embodiments, the first shielding frame 27 and the second shielding frame 28 may be provided with the second protrusion portions 2911, and the surface of the column 291 may be provided with a second clamping slot 272 that fits the second protrusion portion 2911. The implementation of the second protrusion portion 2911 and the second clamping slot 272 may be the same as or similar to those in the foregoing embodiments.

Referring to FIG. 14, in some embodiments, some of the plurality of columns 291 may be distributed on edges of a surface of the shared shielding cover 29 that faces toward the first shielding frame 27, and other columns 291 may be distributed on edges of a surface of the shared shielding cover 29 that faces toward the second shielding frame 28, to improve the connection reliability between the first shielding frame 27 and the shared shielding cover 29, and between the second shielding frame 28 and the shared shielding cover 29. For example, when the shared shielding cover 291 is a circular plate-like structure, the columns 291 may be evenly distributed at intervals in the circumferential direction. When the shared shielding cover 291 is a rectangular plate-like structure, the columns 291 may be evenly distributed along the rectangle at intervals.

Figure 16:
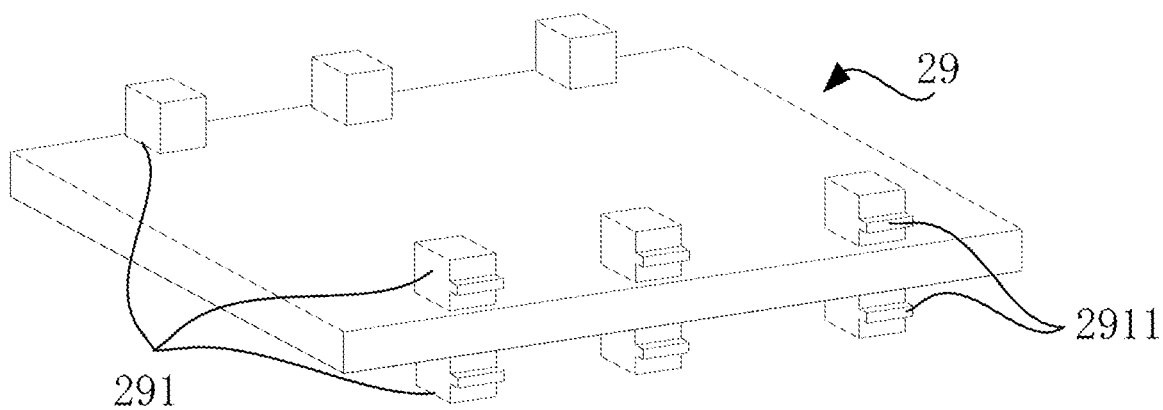
FIG. 16 is an exploded schematic structural diagram of a circuit board assembly according to still another embodiment of this application.

FIG. 16 is an exploded schematic structural diagram of a circuit board assembly according to still another embodiment of this application. Referring to FIG. 16, in some embodiments, some of the plurality of columns 291 may be distributed on two opposite edges of a surface of the shared shielding cover 29 that faces toward the first shielding frame 27, and other columns 291 may be distributed on two opposite edges of a surface of the shared shielding cover 29 that faces toward the second shielding frame 28, to reduce the assembly difficulty of the first shielding frame 27, the second shielding frame 28, and the shared shielding cover 29. For example, when the shared shielding cover 291 is a rectangular plate-like structure, the columns 291 may be distributed on two opposite side edges of the rectangular plate-like structure.

In other embodiments, the shared shielding cover 29 may be provided with a plurality of columns 291 on a surface facing toward the first shielding frame 27, and the plurality of columns 291 are clamped with the first shielding frame 27. The second shielding frame 28 may be clamped with the first shielding frame 27, or the second shielding frame 28 may abut against the shared shielding cover 29, or the second shielding frame 28 may be connected to the shared shielding cover 29 in a non-detachable manner. The implementation of the clamping between the columns 291 and the first shielding frame 27 may be the same as or similar to that in the foregoing embodiment.

In other embodiments, the shared shielding cover 29 may be provided with a plurality of columns 291 on a surface facing toward the second shielding frame 28, and the plurality of columns 291 are clamped with the second shielding frame 28. The first shielding frame 27 may be clamped with the second shielding frame 28, or the first shielding frame 27 may abut against the shared shielding cover 29, or the first shielding frame 27 may be connected to the shared shielding cover 29 in a non-detachable manner. The implementation of the clamping between the columns 291 and the second shielding frame 28 may be the same as or similar to that in the foregoing embodiment.

Figure 18:
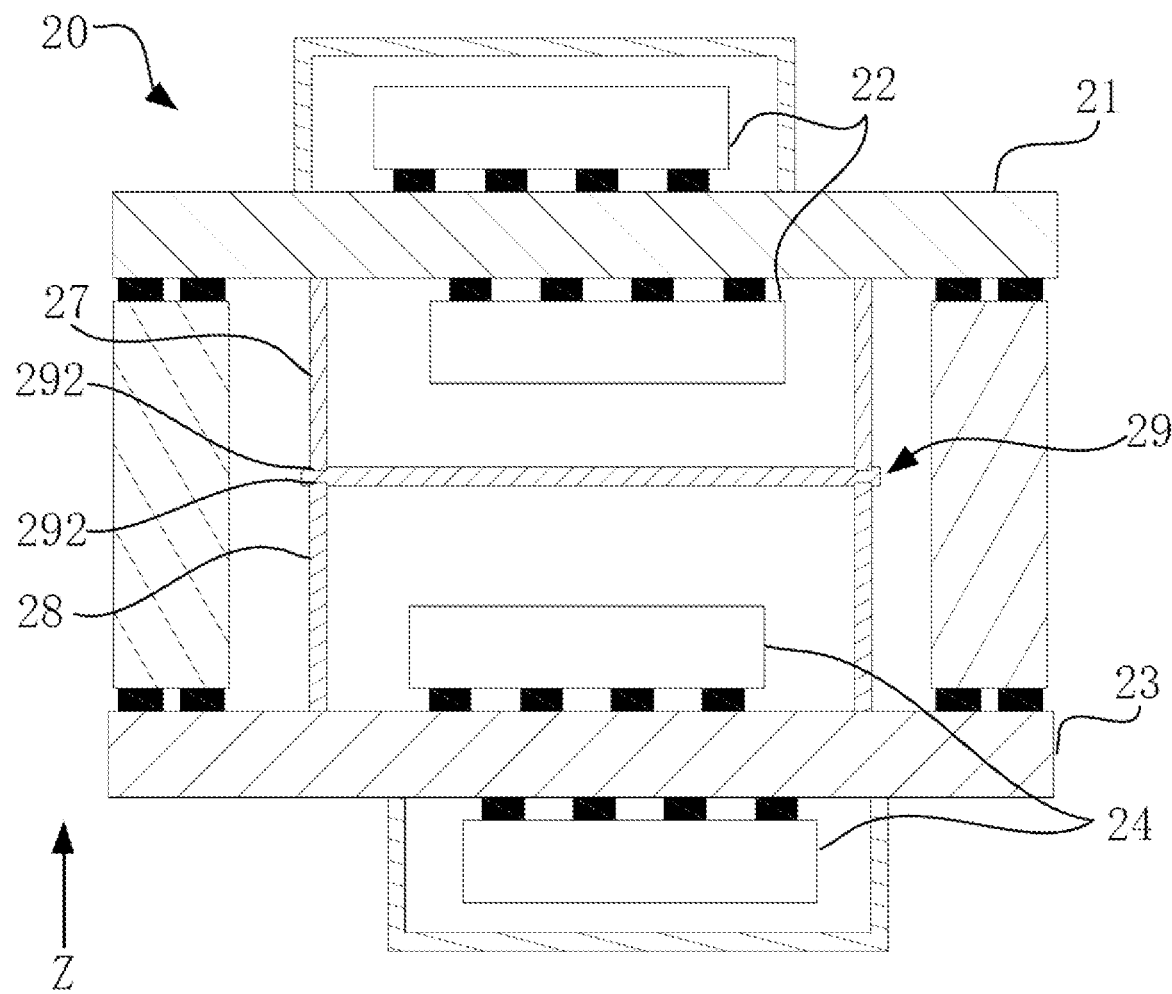
FIG. 18 is a schematic diagram of a cross-sectional structure of a circuit board assembly taken along an F-F direction in FIG. 17 according to an embodiment of this application.

FIG. 17 is an exploded schematic structural diagram of a circuit board assembly according to further another embodiment of this application. FIG. 18 is a schematic diagram of a cross-sectional structure of a circuit board assembly taken along an F-F direction in FIG. 17 according to an embodiment of this application. Arrows Z in FIG. 17 and FIG. 18 are used for indicating a vertical direction.

Referring to FIG. 17 and FIG. 18, in some embodiments, the first shielding frame 27 and the second shielding frame 28 may be plugged with the shared shielding cover 29 to improve assembly flexibility. The shared shielding cover 29 are provided with slots 292 on surfaces facing toward the first shielding frame 27 and the second shielding frame 28, and the first shielding frame 27 and the second shielding frame 28 are inserted in the corresponding slots 292.

The slots 292 on the surface of the shared shielding cover 29 that faces toward the first shielding frame 27 are used as an example for description. It can be understood that, when at least some of the slots 292 on the surface of the shared shielding cover 29 that faces toward the second shielding frame 28 are communicated, the implementation process may be similar to that of the slots 292 on the surface of the shared shielding cover 29 that faces toward the first shielding frame 27.

In some examples, a plurality of slots 292 located on a same surface of the shared shielding cover 29 may be communicated. The plurality of slots 292 may be communicated to define a mating space that matches the shape of the first shielding frame 27. For example, when the first shielding frame 27 is prismatic, at least some of the slots 292 are communicated and the defined matching space may be a quadrilateral annular space. In another example, when the first shielding frame 27 is cylindrical, at least some of the slots 292 are communicated and the defined matching space may be a quadrilateral annular space. End surfaces of an end of the first shielding frame 27 that faces toward the shared shielding cover 29 may be inserted into the corresponding slots 292, so that the first shielding frame 27, the shared shielding cover 29, the first circuit board 21 define a relatively closed shielding cavity.

In other examples, the slots 292 may not be communicated. For example, slots 292 are provided on two opposite edges of a surface of the shared shielding cover 29. Correspondingly, among the plurality of end surfaces of the end of the first shielding frame 27 that faces toward the shared shielding cover 29, two corresponding end surfaces are provided with extending portions that are inserted in the corresponding slots 292, and other end surfaces of the end of the first shielding frame 27 that faces toward the shared shielding cover 29 may be in contact with the second surface of the first circuit board 21.

In other embodiments, one of the first shielding frame 27 and the second shielding frame 28 may be plugged with the shared shielding cover 29. For example, the shared shielding cover 29 is provided with a slot 292 on a surface facing toward the second shielding frame 28, and the second shielding frame 28 may be inserted into the slot 292. The shared shielding cover 29 may be connected to the first shielding frame 27 in a non-detachable manner, or the first shielding frame 27 abuts against the shared shielding cover 29, or the first shielding frame 27 is clamped with the second shielding frame 28, or the first shielding frame 27 is clamped with the columns on the shared shielding cover 29. In another example, the shared shielding cover 29 is provided with a slot 292 on a surface that faces toward the first shielding frame 27, and the first shielding frame 27 may be inserted into the slot 292. The shared shielding cover 29 may be connected to the second shielding frame 28 in a non-detachable manner, or the second shielding frame 28 abuts against the shared shielding cover 29, or the second shielding frame 28 is clamped with the first shielding frame 27, or the second shielding frame 28 is clamped with the columns on the shared shielding cover 29.

Figure 19:
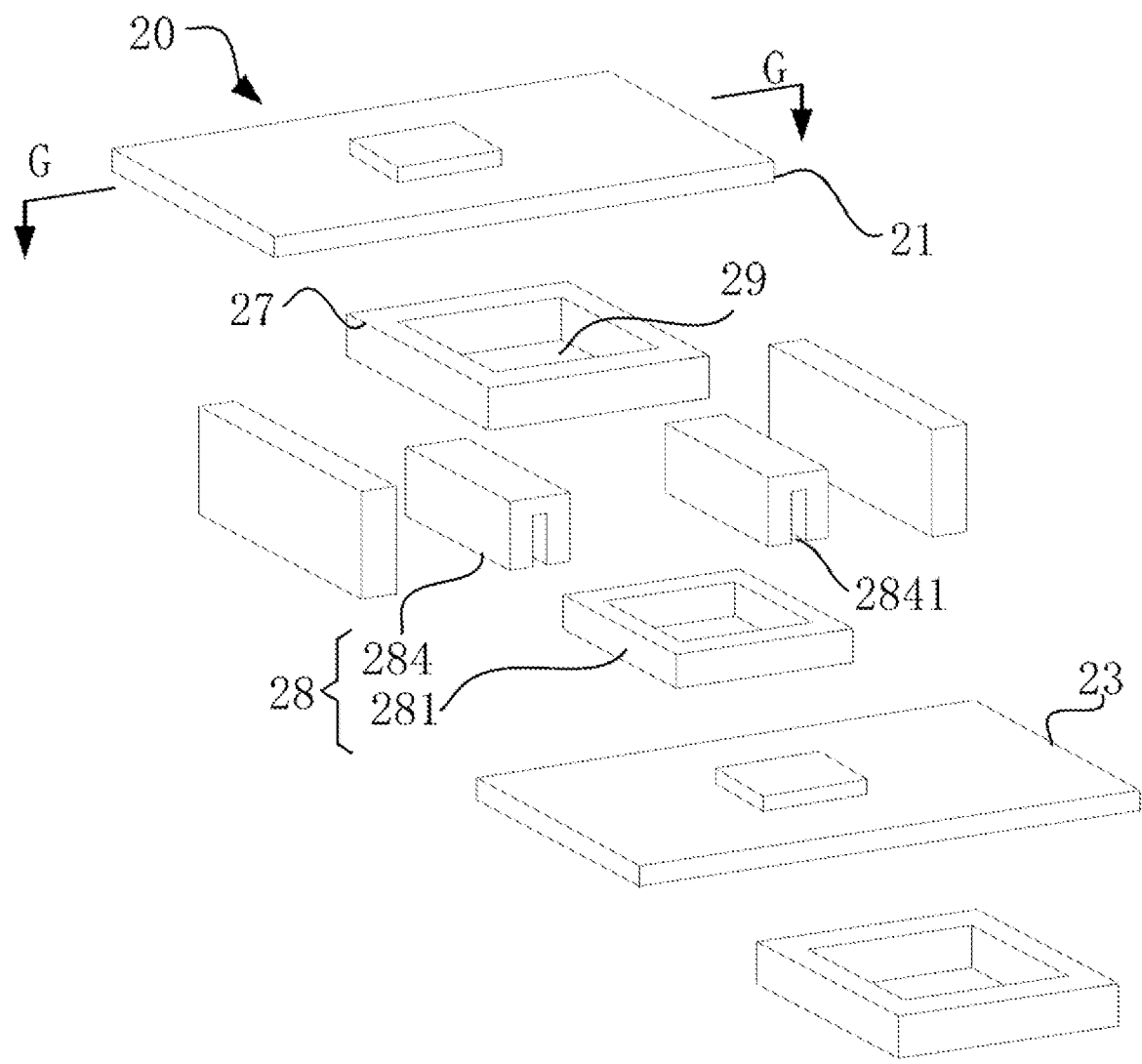
FIG. 19 is an exploded schematic structural diagram of a circuit board assembly according to further another embodiment of this application.
Figure 20:
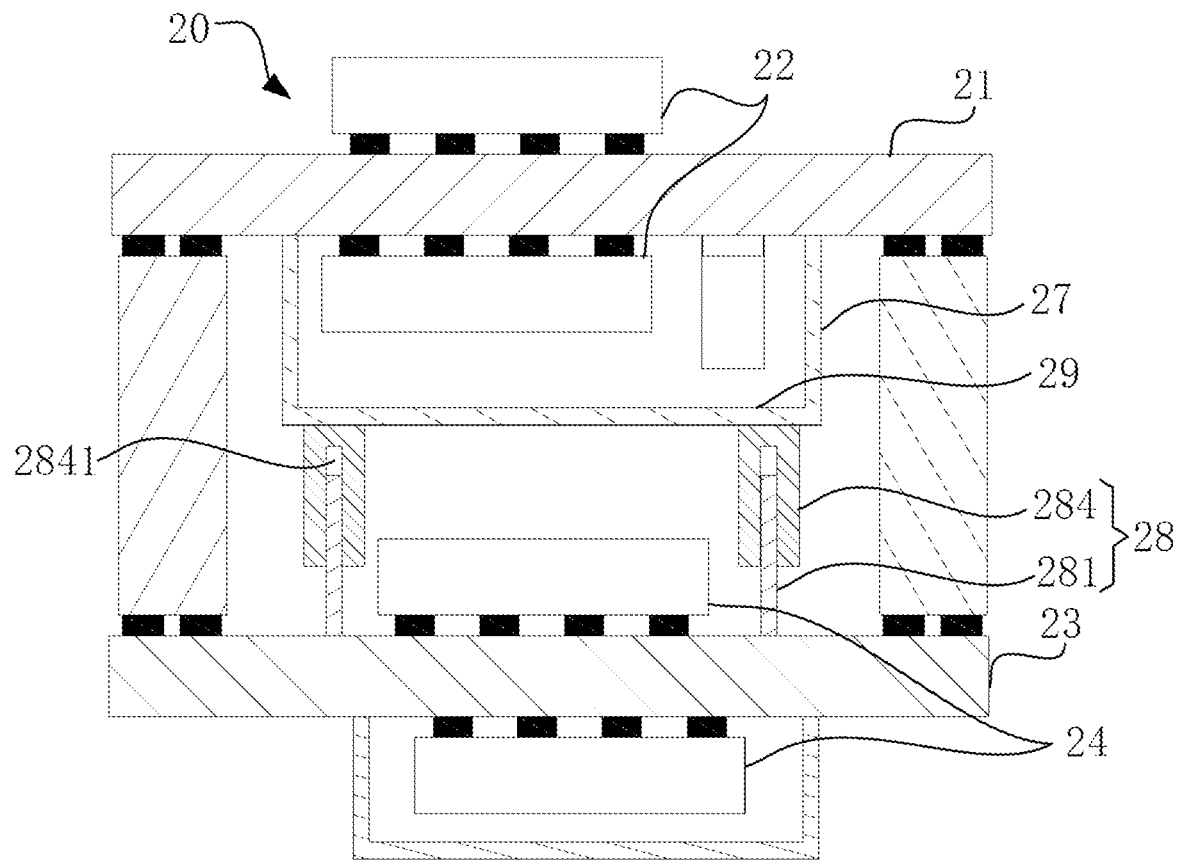
FIG. 20 is a schematic diagram of a cross-sectional structure of a circuit board assembly taken along a G-G direction in FIG. 19 according to an embodiment of this application.

FIG. 19 is an exploded schematic structural diagram of a circuit board assembly according to still another embodiment of this application. FIG. 20 is a schematic diagram of a cross-sectional structure of a circuit board assembly taken along a G-G direction in FIG. 19 according to an embodiment of this application.

Referring to FIG. 19 and FIG. 20, in some embodiments, the second shielding frame 28 may be detachably connected to the shared shielding cover 29 by a magnetic attraction force. The second shielding frame 28 may include a shielding frame body 282 and a magnetic attraction portion 284. The magnetic attraction portion 284 slidably fits an end portion of the shielding frame body 282 that faces toward the shared shielding cover 29, and the magnetic attraction portion 284 is further engaged with the shared shielding cover 29. The magnetic attraction portion 284 may be a magnet. The first shielding frame 27 may be connected to the shared shielding cover 29 in a non-detachable manner. Definitely, the first shielding frame 27 may abut against, or may be clamped or plugged with the shared shielding cover 29.

The magnetic attraction portion 284 may be of a closed annular structure to improve connection reliability. For example, the shielding frame body 282 is cylindrical and the magnetic attraction portion is circular. In another example, the shielding frame body 282 is prismatic, and the magnetic attraction portion is also prismatic.

Alternatively, opposite sides of an end portion of the shielding frame body 282 are each provided with a magnetic attraction portion 284. For example, the shielding frame body 282 is cylindrical and the magnetic attraction portion is arc-shaped. In another example, the shielding frame body 282 is prismatic and the magnetic attraction portion is elongated.

Alternatively, a plurality of block-shaped magnetic attraction portions 284 are provided, and the plurality of magnetic attraction portions 284 may be distributed at intervals in a circumferential direction of the shielding frame body 282.

In some examples, the magnetic attraction portion 284 has a sliding groove 2841 that extends axially along the shielding frame body 282. The magnetic attraction portion 284 may be provided with a sliding groove 2841; alternatively, the magnetic attraction portion 284 includes a plurality of plate-like magnets, where two of the magnets are opposite to each other and spaced apart to form a sliding groove 2841, and another magnet is connected to end portions of the two magnets to be in contact with the shared shielding cover 29. An end portion of the shielding frame body 282 that faces toward the shared shielding cover 29 is slidably disposed in the sliding groove 2841. This helps increase the contact area between the magnetic attraction portion and the shielding frame body 282, thereby improving the connection reliability.

Figure 21:
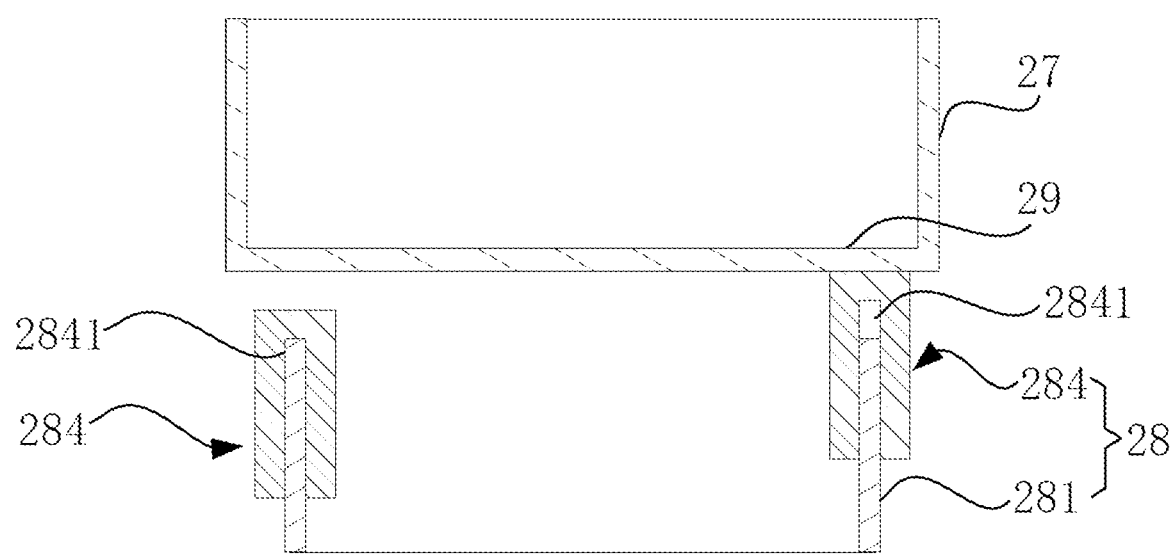
FIG. 21 is a first assembly schematic diagram of magnetic attraction portions according to an embodiment of this application.
Figure 22:
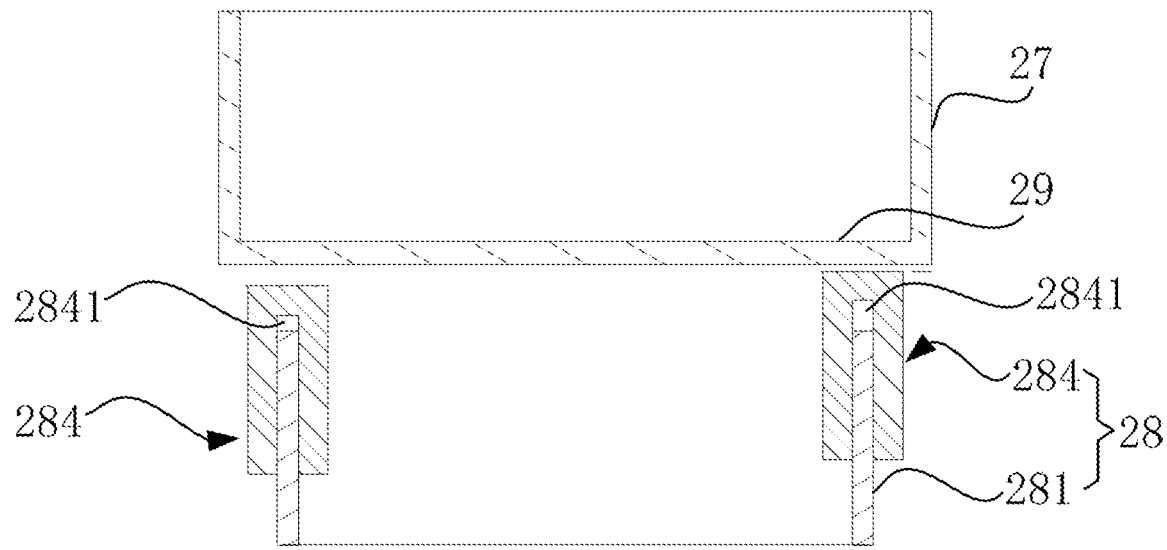
FIG. 22 is a second assembly schematic diagram of magnetic attraction portions according to an embodiment of this application.

FIG. 21 is a first assembly schematic diagram of magnetic attraction portions according to an embodiment of this application. FIG. 22 is a second assembly schematic diagram of magnetic attraction portions according to an embodiment of this application. The magnetic attraction portion 284 on the left side in FIG. 21 is located in an original position, and the magnetic attraction portion 284 on the right side in FIG. 21 is located in an assembly position in contact with the shared shielding cover 29. The magnetic attraction portion 284 on the left side in FIG. 22 slides away from an original position toward an assembly position, and the magnetic attraction portion 284 on the right side in FIG. 22 is about to reach the assembly position.

Referring to FIG. 21 and FIG. 22, during assembly, an end portion of the shielding frame body 282 that faces toward the shared shielding cover 29 is inserted into the sliding groove 2841 of the magnetic attraction portion 284. When the magnetic attraction force between the magnetic attraction portion 284 and the shared shielding cover 29 is less than or equal to the gravity of the magnetic attraction portion 284 (the magnetic attraction portion 284 on the left side in FIG. 21), the magnetic attraction portion 284 may be arranged at the end portion of the shielding frame body 282 under the action of the gravity of the magnetic attraction portion 284. The magnetic attraction portion 284 may slide toward the shared shielding cover 29 under the action of an external force. When the magnetic attraction force between the magnetic attraction portion 284 and the shared shielding cover 29 is greater than the gravity of the magnetic attraction portion 284 (the magnetic attraction portion 284 shown in FIG. 22), the magnetic attraction portion 284 may slide to the assembly position in contact with the shared shielding cover 29 under the action of the magnetic attraction force (the magnetic attraction portion 284 on the right side in FIG. 21). It can be understood that, a smaller distance between the magnetic attraction portion 284 and the shared shielding cover 29 causes a larger magnetic attraction force between the magnetic attraction portion 284 and the shared shielding cover 29.

In other examples, the magnetic attraction portion 284 may be disposed on an outer surface of the shielding frame body 282, and the magnetic attraction portion 284 can slide relative to the outer surface of the shielding frame body 282 to be in contact with the shared shielding cover 29.

In other examples, the magnetic attraction portion 284 may be disposed on an inner surface of the shielding frame body 282, and the magnetic attraction portion 284 can slide relative to the inner surface of the shielding frame body 282 to be in contact with the shared shielding cover 29.

Figure 23:
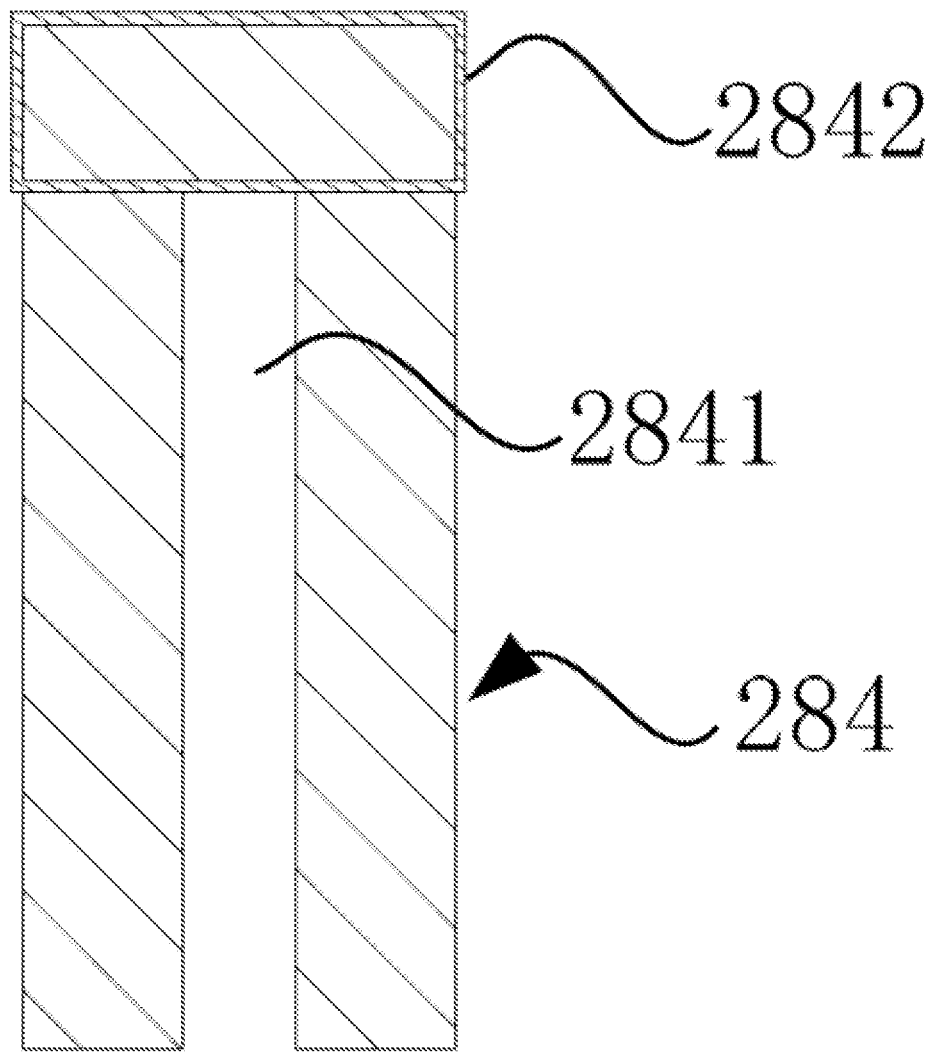
FIG. 23 is a schematic diagram of a cross-sectional structure of a magnetic attraction portion according to an embodiment of this application.

FIG. 23 is a schematic diagram of a cross-sectional structure of a magnetic attraction portion taken along a G-G direction in FIG. 19 according to an embodiment of this application. Referring to FIG. 23, in order to improve the shielding effect, the surface of the magnetic attraction portion 284 may be provided with an electromagnetic shielding layer 2842 made of an electromagnetic shielding material. When the magnetic attraction portion 284 is provided with a sliding groove 2841, the magnetic attraction portion 284 is provided with an electromagnetic shielding layer 2842 on a surface facing toward the shared shielding cover 29. The magnetic attraction portion 284 is provided with an electromagnetic shielding layer 2842 on an inner surface facing towards the shielding cavity, or the magnetic attraction portion 284 is provided with an electromagnetic shielding layer 2842 on an outer surface away from the shielding cavity. When the magnetic attraction portion 284 is formed by a plurality of magnets connected together, the electromagnetic shielding layers 2842 are provided on surfaces of the magnets that face toward the shared shielding covers 29. The electromagnetic shielding layer 2842 may also be provided on a surface of the magnet located on an inner side or outer side of the shielding frame body 282.

Alternatively, the magnetic attraction portion 284 includes a plurality of plate-like magnets, where two of the magnets are opposite to each other and spaced apart to form a sliding groove 2841, another magnet is connected to end portions of the two magnets to be in contact with the shared shielding cover 29. An end portion of the shielding frame body 282 that faces toward the shared shielding cover 29 is slidably disposed in the sliding groove 2841.

In other embodiments, the first shielding frame 27 may be connected to the shared shielding cover 29 by a magnetic attraction force, and the implementation process is similar to that of the foregoing embodiments. The second shielding frame 28 may be connected to the shared shielding cover 29 in a non-detachable manner. Definitely, the second shielding frame 28 may abut against, or may be clamped or plugged with the shared shielding cover 29.

In other embodiments, the first shielding frame 27 and the second shielding frame 28 are separately connected to the shared shielding cover 29 by a magnetic attraction force, and the implementation process is similar to that of the foregoing embodiments.

In the description of the embodiments of this application, it should be noted that, unless otherwise explicitly stipulated and restricted, terms "installation", "joint connection", and "connection" should be understood broadly, which, for example, may be a fixed connection, or may be an indirect connection by using a medium, or may be an internal communication between two components, or may be an interactive relationship between two components. A person of ordinary skill in the art can understand specific meanings of the foregoing terms in the embodiments of this application according to a specific situation.

The embodiments of this application imply that the mentioned apparatus or element needs to have a particular direction and be constructed and operated in the particular direction, and therefore cannot be understood as a limitation on the embodiments of this application. In the description of the embodiments of this application, unless otherwise specifically limited, "a plurality of" means two or more than two.

In the specification, claims, and the foregoing accompanying drawings of the embodiments of this application, the terms "first", "second" are intended to distinguish between similar objects rather than indicating a specific order. It should be understood that data used in this way is interchangeable in a suitable case, so that the embodiments of the embodiments of this application described herein can be implemented in a sequence in addition to the sequence shown or described herein. In addition, the terms "comprising", "having", or any other variant thereof are intended to cover a non-exclusive inclusion.

The term "more" in this specification refers to two or more than two. The term "and/or" in this specification is only an association relationship for describing associated objects, and represents that three relationships may exist, for example, A and/or B may represent the following three cases: A exists separately, both A and B exist, and B exists separately.

Understandably, various reference numerals in the embodiments of this application are merely for differentiation for ease of description, and are not intended to limit the scope of the embodiments of this application.

It should be understood that in the embodiments of this application, an order of sequence numbers of the foregoing processes does not indicate an execution sequence, and execution sequences of the processes should be determined according to functions and internal logics thereof and should not impose any limitation on an implementation process of the embodiments of this application.

What is claimed is:

1. A circuit board assembly, comprising:
a first circuit board; and
a second circuit board stacked with the first circuit board, wherein a first shielding frame is disposed on a surface of the first circuit board that faces toward the second circuit board, a second shielding frame is disposed on a surface of the second circuit board that faces toward the first circuit board, and opposite end portions of the first shielding frame and the second shielding frame are connected to a shared shielding cover in a manner that the shared shielding cover, the first shielding frame, and the second shielding frame enclose a first shielding cavity and a second shielding cavity, and wherein at least one of the first shielding frame or the second shielding frame comprises:

a shielding frame body; and an elastic abutment portion, wherein the elastic abutment portion is disposed at an end portion of the shielding frame body that faces toward the shared shielding cover, the elastic abutment portion abuts against the shared shielding cover, the elastic abutment portion is tilted relative to the shielding frame body, and in a direction away from the shielding frame body, the elastic abutment portion is tilted toward an interior of the shielding cavity.

2. The circuit board assembly according to claim 1, wherein at least one of the first shielding frame or the second shielding frame is detachably connected to the shared shielding cover.

3. The circuit board assembly according to claim 1, wherein elastic abutment portion abuts against a surface of the shared shielding cover that faces toward the shielding frame body.

4. The circuit board assembly according to claim 1, wherein the first shielding frame is detachably connected to the shared shielding cover, and the second shielding frame is fixedly connected to the shared shielding cover.

5. The circuit board assembly according to claim 1, wherein the first shielding frame and the second shielding frame are both detachably connected to the shared shielding cover.

6. The circuit board assembly according to claim 1, wherein the elastic abutment portion is made of an elastic material having an electromagnetic shielding effect.

7. The circuit board assembly according to claim 1, wherein the elastic abutment portion and the shielding frame body are integrally formed.

8. The circuit board assembly according to claim 1, wherein the elastic abutment portion and the shielding frame body are welded together.

9. The circuit board assembly according to claim 1, wherein the elastic abutment portion comprises a plurality of elastic plates.

10. The circuit board assembly according to claim 9, wherein a groove extends in the shared shielding cover, and the elastic abutment portion extends in the groove.

11. An electronic device, comprising: a housing and a circuit board assembly, wherein the circuit board assembly is disposed in an accommodating space of the housing, and the circuit board assembly comprises:

a first circuit board; and a second circuit board stacked with the first circuit board, wherein a first shielding frame is disposed on a surface of the first circuit board that faces toward the second circuit board, a second shielding frame is disposed on a surface of the second circuit board that faces toward the first circuit board, and opposite end portions of the first shielding frame and the second shielding frame are connected to a shared shielding cover in a manner that the shared shielding cover, the first shielding frame, and the second shielding frame enclose a first shielding cavity and a second shielding cavity, and wherein at least one of the first shielding frame or the second shielding frame comprises:

a shielding frame body; and an elastic abutment portion, wherein the elastic abutment portion is disposed at an end portion of the shielding frame body that faces toward the shared shielding cover, the elastic abutment portion abuts against the shared shielding cover, the elastic abutment portion is tilted relative to the shielding frame body, and in a direction away from the shielding frame body, the elastic abutment portion is tilted toward an interior of the shielding cavity.

12. The electronic device according to claim 11, wherein at least one of the first shielding frame or the second shielding frame is detachably connected to the shared shielding cover.

13. The electronic device according to claim 11, wherein the elastic abutment portion abuts against a surface of the shared shielding cover that faces toward the shielding frame body.

14. The electronic device according to claim 11, wherein the first shielding frame is detachably connected to the shared shielding cover, and the second shielding frame is fixedly connected to the shared shielding cover.

15. The electronic device according to claim 11, wherein the first shielding frame and the second shielding frame are both detachably connected to the shared shielding cover.

16. The electronic device according to claim 11, wherein the elastic abutment portion is made of an elastic material having an electromagnetic shielding effect.

17. The electronic device according to claim 11, wherein the elastic abutment portion and the shielding frame body are integrally formed.

18. The electronic device according to claim 11, wherein the elastic abutment portion and the shielding frame body are welded together.

19. The electronic device according to claim 11, wherein the elastic abutment portion comprises a plurality of elastic plates.

20. The electronic device according to claim 11, wherein a groove extends in the shared shielding cover, and the elastic abutment portion extends in the groove.

* * * * *